United States Patent
Huang

(10) Patent No.: US 12,439,615 B2
(45) Date of Patent: Oct. 7, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Meng Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/936,846

(22) Filed: Sep. 29, 2022

(65) Prior Publication Data

US 2023/0014263 A1    Jan. 19, 2023

Related U.S. Application Data

(63) Continuation of application No. PCT/CN2022/105642, filed on Jul. 14, 2022.

(30) Foreign Application Priority Data

Jun. 24, 2022    (CN) .......................... 202210729634.5

(51) Int. Cl.
*H01L 49/02* (2006.01)
*H01L 21/308* (2006.01)
(Continued)

(52) U.S. Cl.
CPC ........... *H10D 1/042* (2025.01); *H01L 21/308* (2013.01); *H01L 21/76224* (2013.01);
(Continued)

(58) Field of Classification Search
CPC ........ H10D 1/711; H10D 1/714; H10D 1/716; H01L 21/308; H01L 21/3083
See application file for complete search history.

(56) References Cited

U.S. PATENT DOCUMENTS

2019/0103407 A1*  4/2019  Kim ...................... H10B 12/30
2020/0111793 A1   4/2020  Kim et al.
(Continued)

FOREIGN PATENT DOCUMENTS

| CN | 101540325 A | 9/2009 |
|---|---|---|
| CN | 109616474 A | 4/2019 |

(Continued)

OTHER PUBLICATIONS

Japan patent office action in application No. 2023-537377, mailed on Aug. 6, 2024.

(Continued)

*Primary Examiner* — John A Bodnar
(74) *Attorney, Agent, or Firm* — SYNCODA LLC; Feng Ma

(57) ABSTRACT

A method for forming a semiconductor structure includes the following: providing a semiconductor substrate, in which stack structures and isolation structures alternately arranged along a first direction are formed on the semiconductor substrate; forming a support structure in the stack structures and the isolation structures; etching the stack structures and the isolation structures to form multiple zigzag first semiconductor pillars in an array arrangement along the first direction and a second direction, in which an interspace is formed between the zigzag first semiconductor pillars; each zigzag first semiconductor pillar comprises first convex structures and first concave structures alternately arranged along a third direction, and is supported by the support structure; the first direction, the second direction and the third direction are perpendicular to one another, and the second direction is perpendicular to a top surface of the semiconductor substrate; forming capacitor structures the interspace.

15 Claims, 39 Drawing Sheets

(51) Int. Cl.
  *H01L 21/762* (2006.01)
  *H01L 27/108* (2006.01)
  *H10B 12/00* (2023.01)
  *H10D 1/00* (2025.01)
  *H10D 1/68* (2025.01)
  *H10D 30/67* (2025.01)

(52) U.S. Cl.
  CPC ............. *H10B 12/00* (2023.02); *H10D 1/716* (2025.01); *H10D 30/6735* (2025.01)

(56) References Cited

U.S. PATENT DOCUMENTS

2021/0057416 A1  2/2021  Kim et al.
2022/0108988 A1  4/2022  Kim et al.

FOREIGN PATENT DOCUMENTS

| CN | 110504284 A | 11/2019 |
| CN | 112151546 A | 12/2020 |
| CN | 114582809 A | 6/2022 |
| JP | 2007184554 A | 7/2007 |
| JP | 2019068067 A | 4/2019 |
| JP | 2020141129 A | 9/2020 |

OTHER PUBLICATIONS

Seung-Geun Jung et al., Analytical Model of Contact Resistance in Vertically Stacked Nanosheet FETs for Sub-3-nm Technology Node, IEEE Transactions on Electron Devices, vol. 69, No. 3, Mar. 2022.
Capillary Pattern Collapse: Prediction and Prevention from Past to Future, D. W. Bassett, Tokyo Electron America, Austin Texas 78613, USA, ECS Transactions, 92 (2) 95-106 (2019).

* cited by examiner

SEMICONDUCTOR STRUCTURE AND METHOD FOR FORMING SAME

CROSS-REFERENCE TO RELATED APPLICATIONS

This is a continuation of International Application No. PCT/CN2022/105642 filed on Jul. 14, 2022, which claims priority to Chinese Patent Application No. 202210729634.5 filed on Jun. 24, 2022. The disclosures of the above-referenced applications are hereby incorporated by reference in their entirety.

BACKGROUND

A sense amplifier (SA) is typically connected to a pair of complementary digital lines (for example, bit lines) for sensing the change of the signal on the two bit lines (BL) and amplifying the change of the signal. The signal sensed by the sense amplifier satisfies the following equation (1):

$$\Delta V_{BL} = \frac{V_{cell} - V_{BLP}}{(1 + C_{BL}/C_s)}$$

in which, $\Delta V_{BL}$ is a voltage difference signal on the bit lines sensed by the sense amplifier, and $V_{cell}$ is the voltage of a memory cell to be sensed, and $V_{BLP}$ is the voltage of a complementary bit line, and $C_{BL}$ is the capacitance of the parasitic capacitor on the bit line in the memory cell to be sensed, and $C_S$ is the capacitance of a capacitor structure in the memory cell to be sensed. It can be seen from the equation (1) that the voltage difference signal $\Delta V_{BL}$ on the bit lines sensed by the sense amplifier is positively correlated with the capacitance of the capacitor structure. Therefore, improving the capacitance of the capacitor structure is of vital importance for the signal amplification accuracy of the sense amplifier.

SUMMARY

The disclosure relates to the technical field of semiconductors, and relates to, but is not limited to, a semiconductor structure and a method for forming the same.

In a first aspect, embodiments of the disclosure provide a method for forming a semiconductor structure, and the method includes the following operations.

A semiconductor substrate is provided, in which stack structures and isolation structures alternately arranged along a first direction are formed on the semiconductor substrate.

A support structure is formed in the stack structures and the isolation structures.

The stack structures and the isolation structures are etched to form a plurality of zigzag first semiconductor pillars in an array arrangement along the first direction and a second direction, in which an interspace is formed between the zigzag first semiconductor pillars. Each of the zigzag first semiconductor pillars includes first convex structures and first concave structures alternately arranged along a third direction, and the zigzag first semiconductor pillars are supported by the support structure. The first direction, the second direction and the third direction are perpendicular to one another, and the second direction is perpendicular to a top surface of the semiconductor substrate.

Capacitor structures are formed in the interspace.

In a second aspect, embodiments of the disclosure provide an semiconductor structure, the semiconductor structure is formed by the method for forming a semiconductor structure described above, and the semiconductor structure includes: a semiconductor substrate; a plurality of zigzag first semiconductor pillars and a support structure located on a surface of the semiconductor substrate; and capacitor structures filled between the zigzag first semiconductor pillars.

The plurality of the zigzag first semiconductor pillars are in an array arrangement along a first direction and a second direction and are supported by the support structure. Each of the zigzag first semiconductor pillars includes first convex structures and first concave structures alternately arranged along a third direction in sequence. The first direction, the second direction and the third direction are perpendicular to one another, and the second direction is perpendicular to a plane where the semiconductor substrate is located.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The various embodiments discussed herein are generally shown in the accompanying drawings by way of example and not limitation.

DETAILED DESCRIPTION

Figure 1:
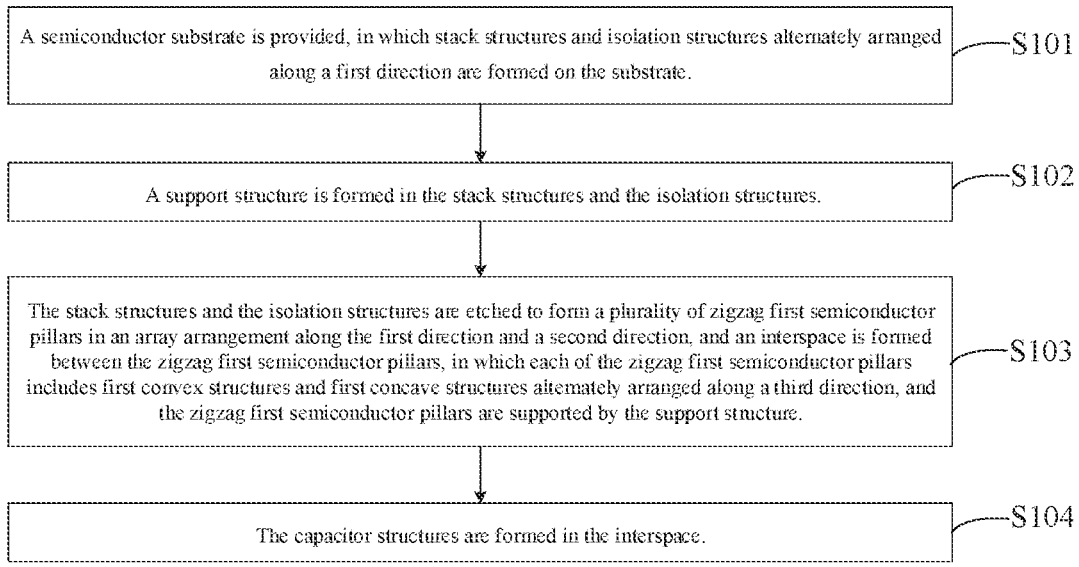
FIG. 1 is a schematic flowchart of a method for forming a semiconductor structure provided by embodiments of the disclosure.

Exemplary embodiments of the disclosure are described in more detail below with reference to the accompanying drawings. While exemplary embodiments of the present disclosure are shown in the drawings, it should be understood that the present disclosure may be implemented in various forms and should not be limited by the specific embodiments set forth herein. In contrast, these embodiments are provided to enable a more thorough understanding of the disclosure and to fully convey the scope of the disclosure to those skilled in the art.

In the following description, numerous specific details are set forth in order to provide the more thorough understanding of the disclosure. However, it is apparent to those skilled in the art that the disclosure may be implemented without one or more of these details. In other embodiments, in order to avoid confusion with the present disclosure, some technical features known in the art are not described. That is, not all features of actual embodiments are described herein, and well-known functions and constructions are not described in detail.

In the drawings, the dimensions of a layer, a region, an element or their relative dimensions may be magnified for clarity. The same reference numeral indicates the same element throughout.

It should be understood that when the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although the terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While a second element, component, region, layer or section is discussed, it does not mean that a first element, component, region, layer or section is necessarily present in the disclosure.

The terms used here are only intended to describe the specific embodiments and are not limitations to the disclosure. As used here, the singular forms "a", "an" and "said/ the" are also intended to include plural forms, unless the context clearly indicates otherwise. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, the term "and/or" includes any and all combinations of related items listed.

Before introducing the embodiments of the disclosure, three directions for that may be used to describe a stereo structure in the following embodiments are defined, and the three directions may include X-axis direction, Y-axis direction and Z-axis direction. In the directions of the top surface and the bottom surface of the substrate (i.e., the plane where the substrate is located), two directions that intersect each other (e.g., perpendicular to each other) are defined. For example, an extension direction of a capacitor structure can be defined as a third direction, and a direction in which stack structures and isolation structures are alternately arranged can be defined as a first direction, and the plane direction of the substrate can be determined based on the third direction and the first direction. The substrate may include a top surface on the front side and a bottom surface on the back side opposite the front side. When the flatness of the top surface and the bottom surface is ignored, the direction perpendicular to the top surface and the bottom surface of the substrate is defined as a second direction. It can be seen from this that the first direction, the second direction and the third direction are perpendicular to each other. In the embodiments of the disclosure, the first direction is defined as the X-axis direction, and the second direction is defined as the Y-axis direction, and the third direction is defined as the Z-axis direction.

Embodiments of the disclosure provide a method for forming a semiconductor structure, and FIG. 1 is a schematic flowchart of the method for forming a semiconductor structure provided by the embodiments of the disclosure. As shown in FIG. 1, the method for forming a semiconductor structure includes the following operations.

At S101, a semiconductor substrate is provided, in which stack structures and isolation structures alternately arranged along a first direction are formed on the substrate.

In the embodiments of the disclosure, the semiconductor substrate may be a silicon substrate, and the semiconductor substrate may also include other semiconductor elements, for example, germanium (Ge), or include semiconductor compounds, for example, silicon carbide (SiC), gallium arsenide (GaAs), gallium phosphide (GaP), indium phosphide (InP), indium arsenide (InAs), or indium antimonide (InSb), or include other semiconductor alloys, for example, silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP) or combinations thereof.

In the embodiments of the disclosure, the material of the isolation structures may be silicon oxide, silicon nitride, silicon oxynitride, or other suitable materials.

In the embodiments of the disclosure, each of the stack structures includes first semiconductor layers and second semiconductor layers alternately stacked along the second direction. The material of the first semiconductor layers may be germanium, silicon germanium (SiGe), silicon carbide, silicon-on-insulator (SOI) or germanium-on-insulator (GOI). The second semiconductor layers may be silicon layers, and may also include other semiconductor elements, for example, germanium, or include semiconductor compounds for example, silicon carbide, gallium arsenide, gallium phosphide, indium phosphide, indium arsenide or indium antimonide, or include other semiconductor alloys, for example, silicon germanium, gallium arsenic phosphide, aluminum indium arsenide, aluminum gallium arsenide, gallium indium arsenide, gallium indium phosphide, and/or gallium indium arsenide phosphide or combinations thereof.

In the embodiments of the disclosure, the materials of the first semiconductor layers and the second semiconductor layers should be different, because it needs to remove the first semiconductor layers in the stack structures subsequently and retain the second semiconductor layers. Therefore, the first semiconductor layers should have a greater selective etching ratio relative to the second semiconductor layers. For example, the etching selection ratio of the first semiconductor layers to the second semiconductor layers may be 5 to 15, so that the first semiconductor layers are prone to be removed by etching than the second semiconductor layers in the etching process.

At S102, a support structure is formed in the stack structures and the isolation structures.

In the embodiments of the disclosure, the material of the support structure may include at least one of silicon oxide, silicon nitride, silicon carbide nitride, silicon oxynitride or silicon boride nitride. The support structure can be formed by any suitable deposition process, for example, a chemical vapor deposition (CVD) process, a physical vapor deposition (PVD) process, an atomic layer deposition process (ALD) process, a spin coating process, a coating process or a thin-film process, etc.

At S103, the stack structures and the isolation structures are etched to form a plurality of zigzag first semiconductor pillars in an array arrangement along the first direction and a second direction, and an interspace is formed between the zigzag first semiconductor pillars. Each of the zigzag first semiconductor pillars includes first convex structures and first concave structures alternately arranged along a third direction, and the zigzag first semiconductor pillars are supported by the support structure.

In the embodiments of the disclosure, the stack structures and the isolation structures may be etched by a dry etching process (for example, a plasma etching process, a reactive ion etching process, or an ion milling process) to form the zigzag first semiconductor pillars. The gas used for the dry etching process may be one or any combination of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$).

In the embodiments of the disclosure, compared with a cylindrical first semiconductor pillar in some implementations, the surface area of the each of the zigzag first semiconductor pillars composed of the first convex structures and the first concave structures alternately arranged is increased. In this way, when capacitor structures are formed in the interspace between the zigzag first semiconductor pillars, the effective area between the electrodes of each of the capacitor structures can be increased, thereby increasing the capacitance of the capacitor structures.

At S104, the capacitor structures are formed in the interspace.

In the embodiments of the disclosure, since the capacitor structures are formed in the interspace between the zigzag first semiconductor pillars and the zigzag first semiconductor pillars have greater surface areas, the effective area between the electrodes of each of the capacitor structures in the embodiments of the disclosure is greater, and thus each of the formed capacitor structures has high capacitance. In this way, the sensing effect of the sense amplifier can be improved, and the retention time of data can be increased.

FIG. 2A to FIG. 2S, FIG. 3A to FIG. 3E, FIG. 4A to FIG. 4E and FIG. 5A to FIG. 5E are schematic structural diagrams during forming a semiconductor structure provided by the embodiments of the present disclosure. The cross-sectional views in the directions of a-a', b-b', c-c', and d-d' are only to clearly describe the internal structure of the semiconductor, and are not drawn to scale. The formation process of the semiconductor structure provided by the embodiments of the disclosure is described in detail below with reference to FIG. 2A to FIG. 2S, FIG. 3A to FIG. 3E, FIG. 4A to FIG. 4E, and FIG. 5A to FIG. 5E.

Figure 2A:
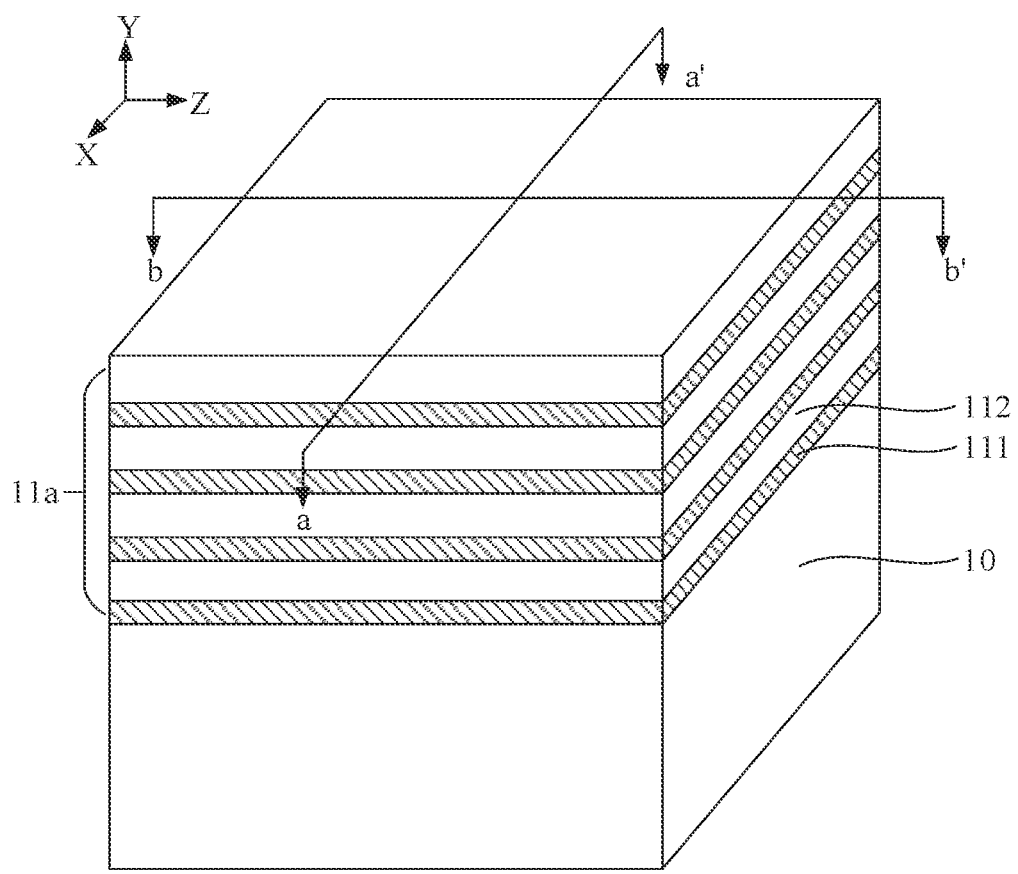
FIG. 2A is a first schematic structural diagram during forming a semiconductor structure provided by first embodiments of the present disclosure.
Figure 2B:
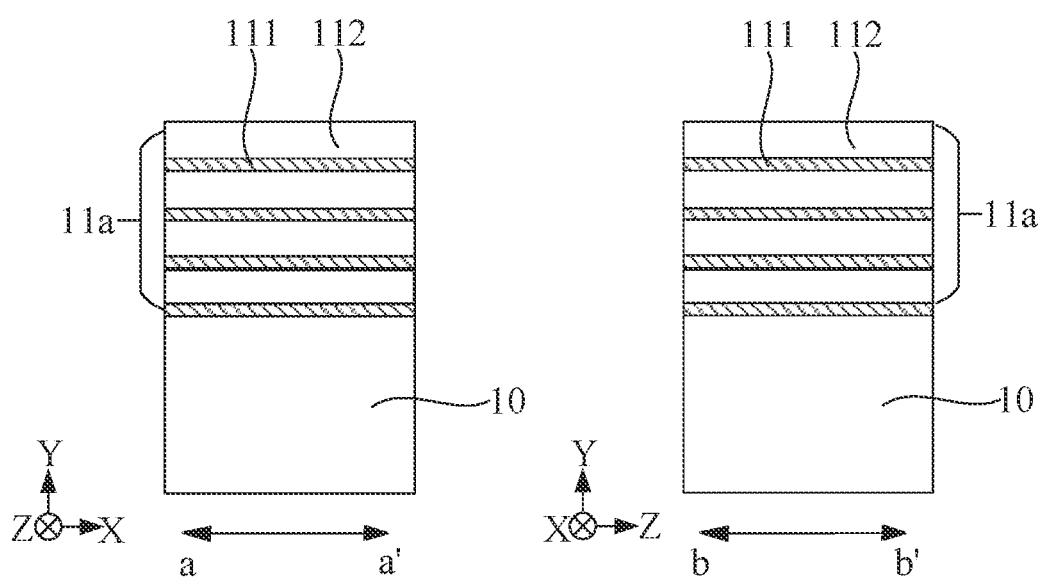
FIG. 2B is a second schematic structural diagram during forming a semiconductor structure provided by first embodiments of the present disclosure.
Figure 2C:
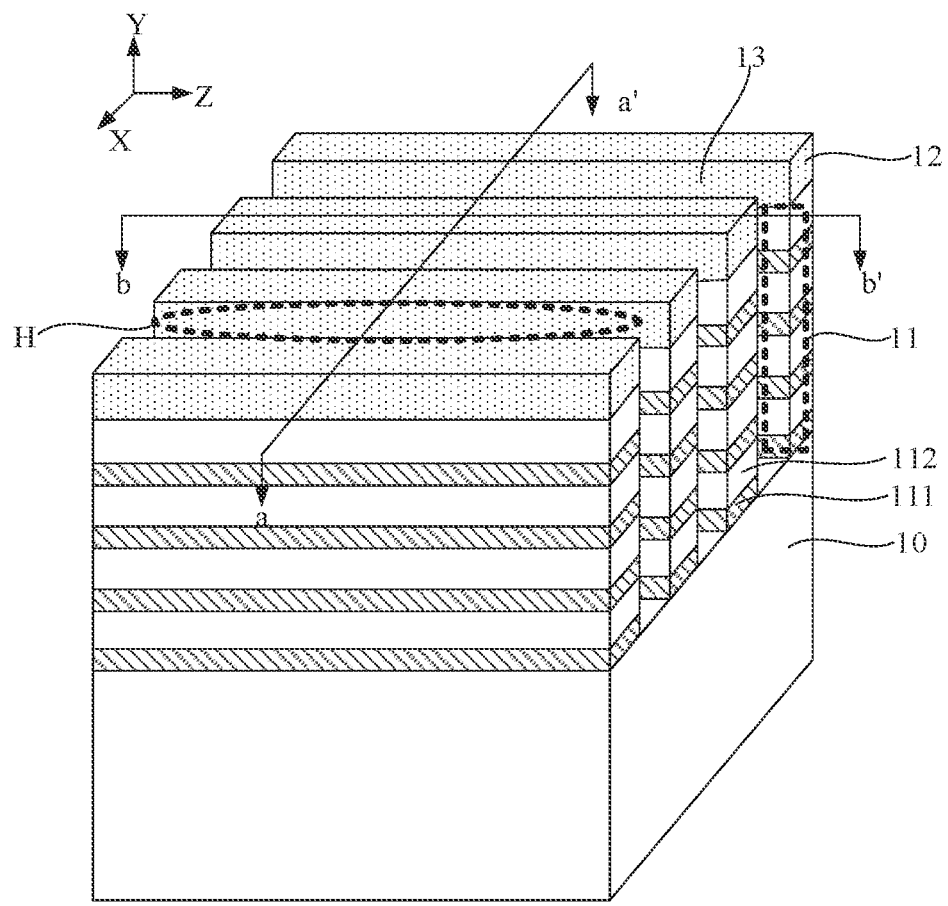
FIG. 2C is a third schematic structural diagram during forming a semiconductor structure provided by first embodiments of the present disclosure.
Figure 2D:
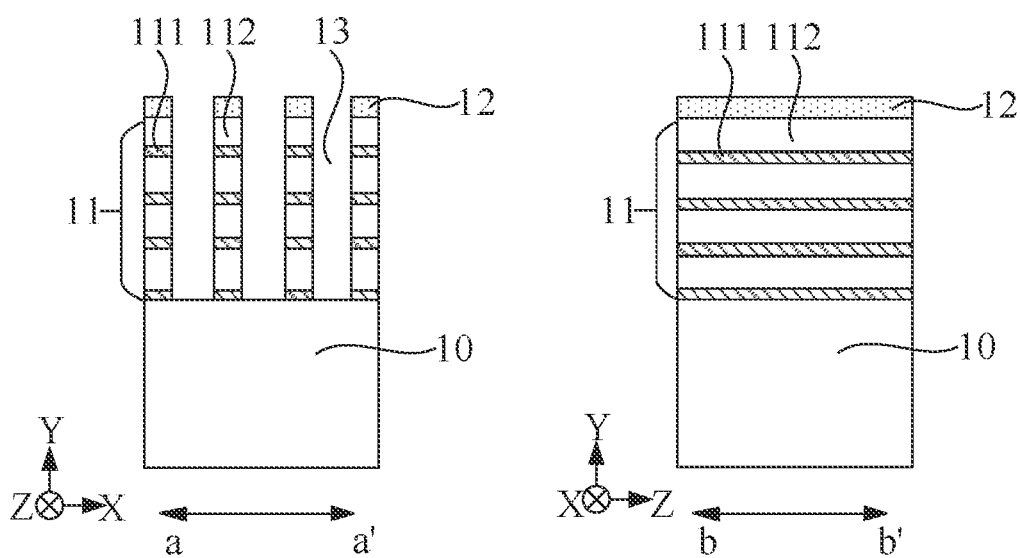
FIG. 2D is a fourth schematic structural diagram during forming a semiconductor structure provided by first embodiments of the present disclosure.
Figure 2E:
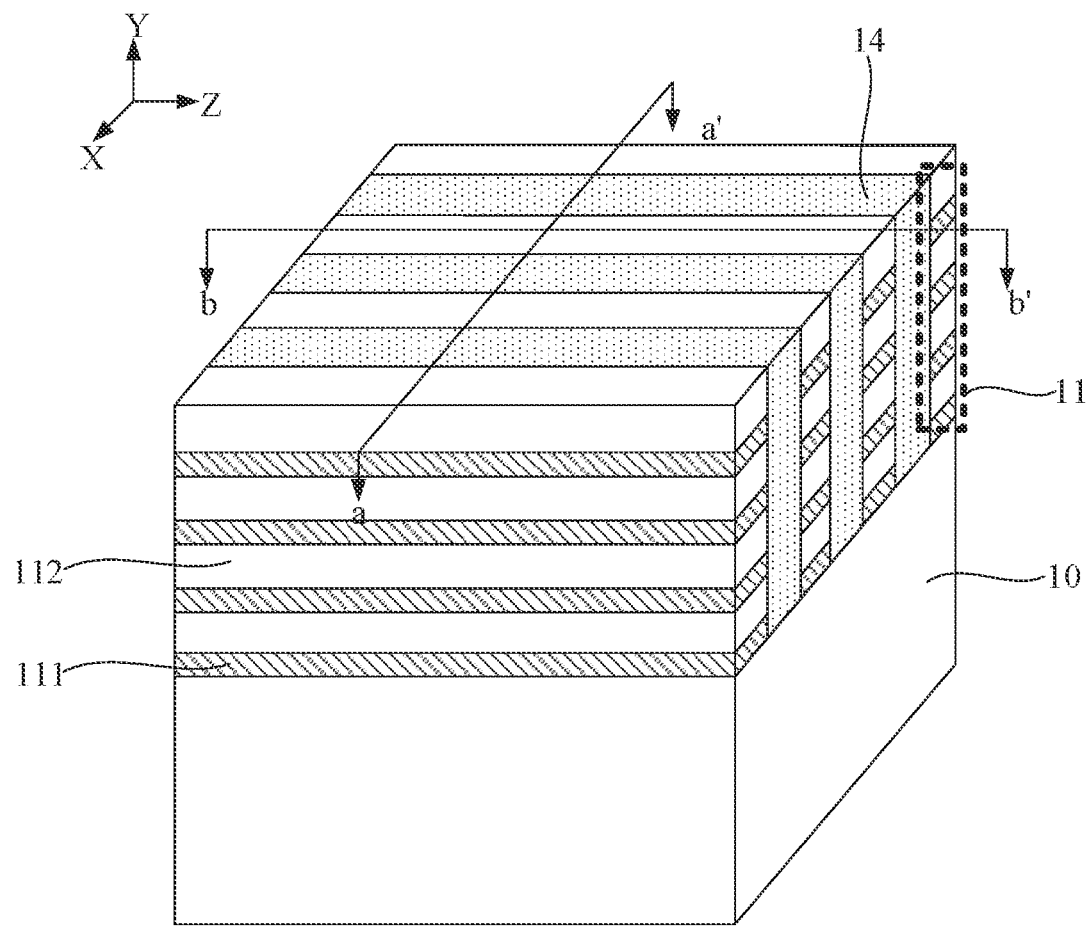
FIG. 2E is a fifth schematic structural diagram during forming a semiconductor structure provided by first embodiments of the present disclosure.
Figure 2F:
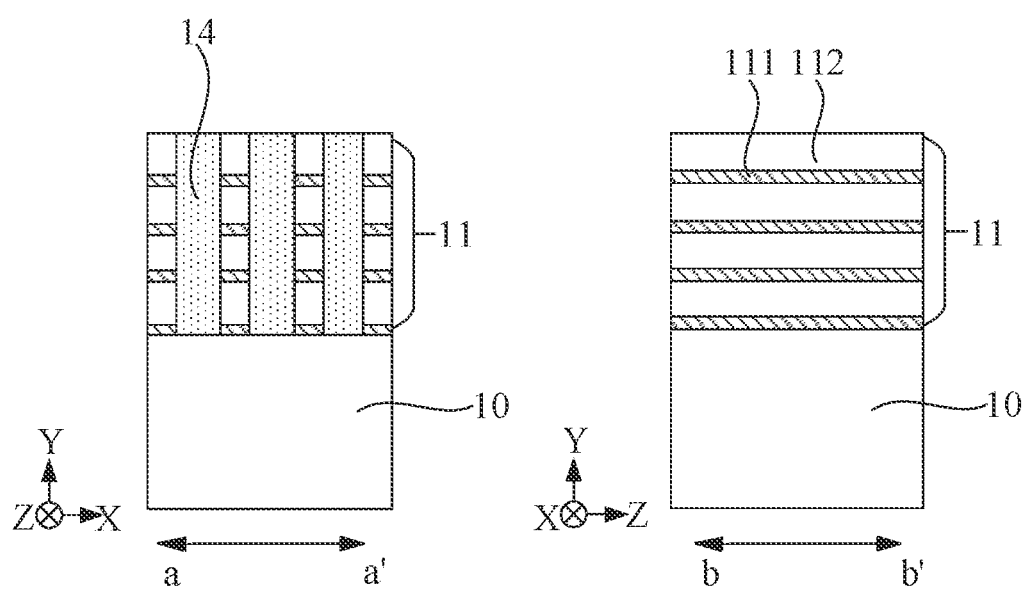
FIG. 2F is a sixth schematic structural diagram during forming a semiconductor structure provided by first embodiments of the present disclosure.

First, referring to FIG. 2A to FIG. 2F, S101 is performed. A semiconductor substrate 10 is provided, in which stack structures 11 and isolation structures 14 alternately arranged along a first direction are provided on the semiconductor substrate 10. FIG. 2A, FIG. 2C and FIG. 2E are three-dimensional views, and FIG. 2B, FIG. 2D and FIG. 2F are the sectional views of FIG. 2A, FIG. 2C and FIG. 2E, respectively.

In some embodiments, the isolation structures 14 may be formed by the following operations. An initial stack structure 11a is formed on the semiconductor substrate 10, in which the initial stack structure 11a includes first semiconductor layers 111 and second semiconductor layers 112 alternately stacked. The initial stack structure 11a is patterned to form the stack structures 11 and isolation trenches 13. An isolation material is filled in the isolation trenches 13 to form the isolation structures 14.

As shown in FIG. 2A and FIG. 2B, the initial stack structure 11a is formed on the semiconductor substrate 10. The initial stack structure 11a includes the first semiconductor layers 111 and the second semiconductor layers 112 stacked alternately in sequence from bottom to up in the Y-axis direction.

In the embodiments of the disclosure, the first semiconductor layers 111 and the second semiconductor layers 112 may be formed by an epitaxial process. A semiconductor super lattice can be formed by alternately stacking the first semiconductor layers 111 and the second semiconductor layers 112. The thickness of each of the semiconductor layers ranges from layers of a few atoms to dozens of atoms, and the main semiconductor property of each of the semiconductor layers, such as the band gap and the doping level, can be controlled independently. The number of the first semiconductor layers 111 and the second semiconductor layers 112 in the stack structures 11 can be disposed according to the required capacitance density (or the storage density). The more the number of the first semiconductor layers 111 and the second semiconductor layers 112, the higher the integration degree and the greater the capacitance density of the formed three-dimensional semiconductor structure. For example, the number of the first semiconductor layers 111 and the second semiconductor layers 112 may be 2 to 2000.

As shown in FIG. 2C and FIG. 2D, the stack structures 11 and the isolation trenches 13 may be formed by the following operations. A first mask layer 12 with a first preset pattern is formed on a surface of the initial stack structure 11a. The first preset pattern includes a plurality of first preset sub-patterns H arranged along X-axis direction in sequence, and first preset sub-patterns H expose part of the initial stack structure 11a. The initial stack structure 11a is etched with the first mask layer 12 to remove the initial stack structure 11a exposed by the first mask layer 12 and form the stack structures 11 and the isolation trenches 13.

In the embodiments of the disclosure, the initial stack structure 11a can be etched by a high aspect ratio (HAR) technology to form the stack structures 11 and the isolation trenches 13.

In some embodiments, after forming the stack structures 11 and the isolation trenches 13, a dry etching process or a wet etching process may be adopted to remove the first mask layer 12 and expose the top surfaces of the stack structures 11.

As shown in FIG. 2E and FIG. 2F, the isolation material is filled in the isolation trenches 13 to form the isolation structures 14. The isolation material may be silicon oxide, silicon nitride or silicon oxynitride.

It should be noted that, in the process of filling the isolation material in the isolation trenches 13 to form the isolation structures 14, part of the isolation material is often deposited on the surfaces of stack structures 11, and then the surfaces of the stack structures 11 are treated by chemical mechanical polishing (CMP), so that a flat and smooth layer of the isolation material is located on the surfaces of each of the stack structures 11, and this layer of the isolation material is used for protecting the second semiconductor layers 112 located on the top surfaces of the stack structures 11 from being damaged when the stack structures 11 are processed subsequently. In the embodiments of the disclosure, for the convenience of describing the method for forming a semiconductor structure, the isolation material located the surfaces of the stack structures 11 is not shown in FIG. 2E to FIG. 2J.

Figure 2G:
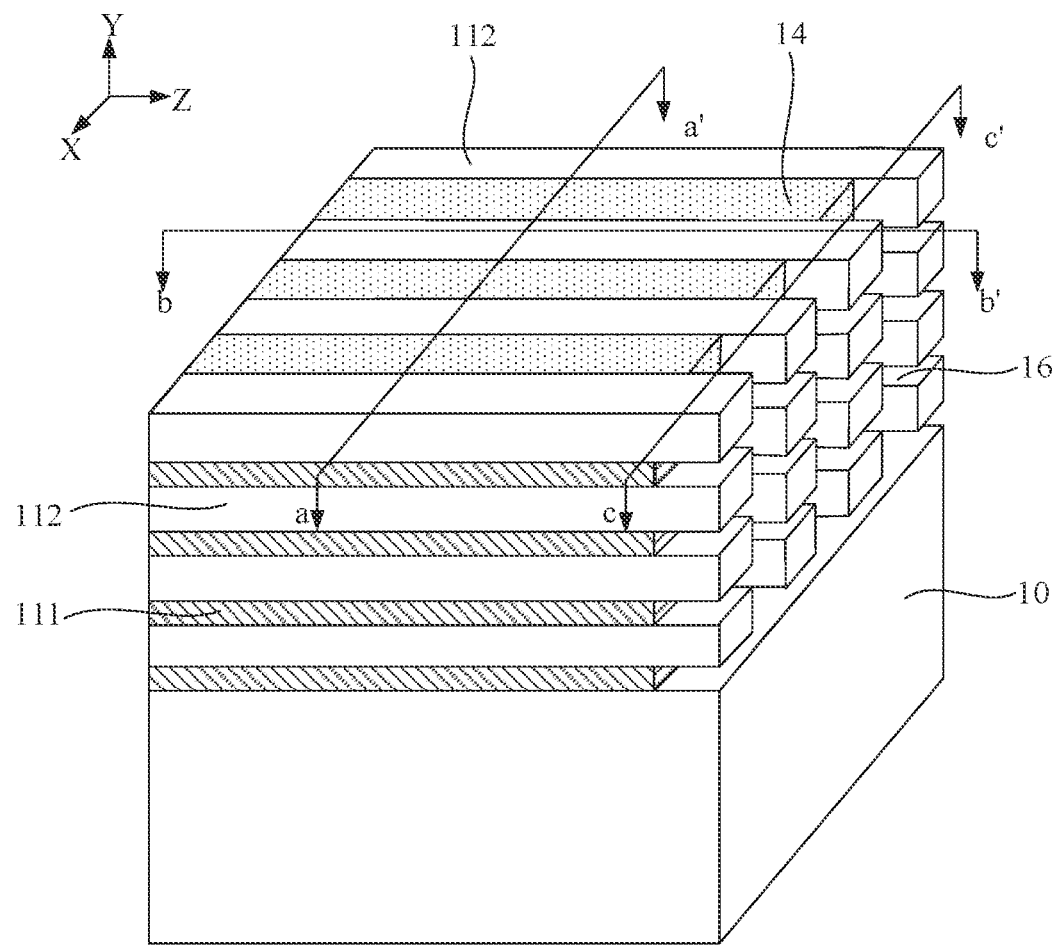
FIG. 2G is a seventh schematic structural diagram during forming a semiconductor structure provided by first embodiments of the present disclosure.
Figure 2H:
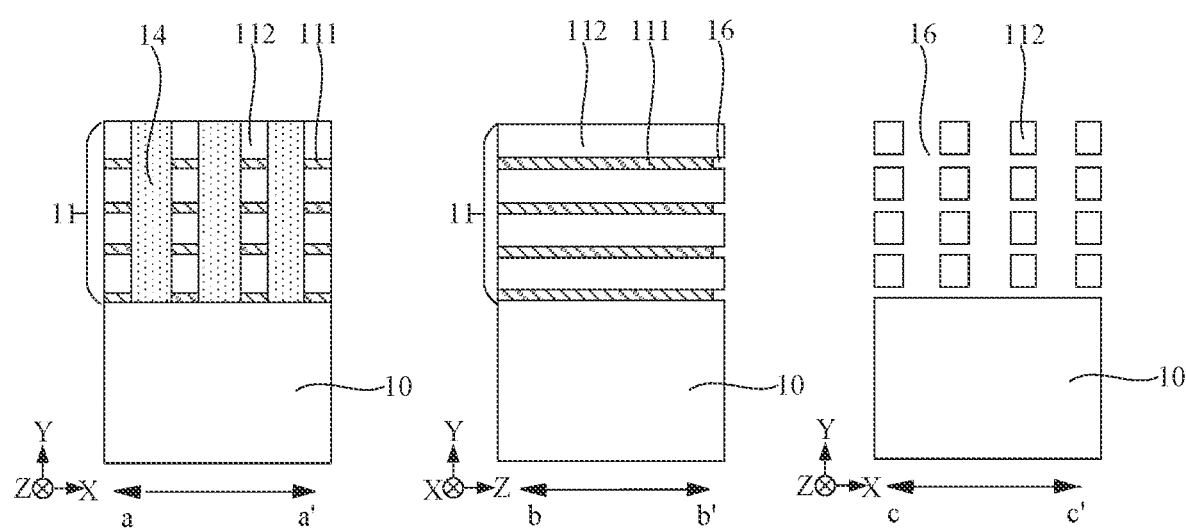
FIG. 2H is an eighth schematic structural diagram during forming a semiconductor structure provided by first embodiments of the present disclosure.
Figure 2I:
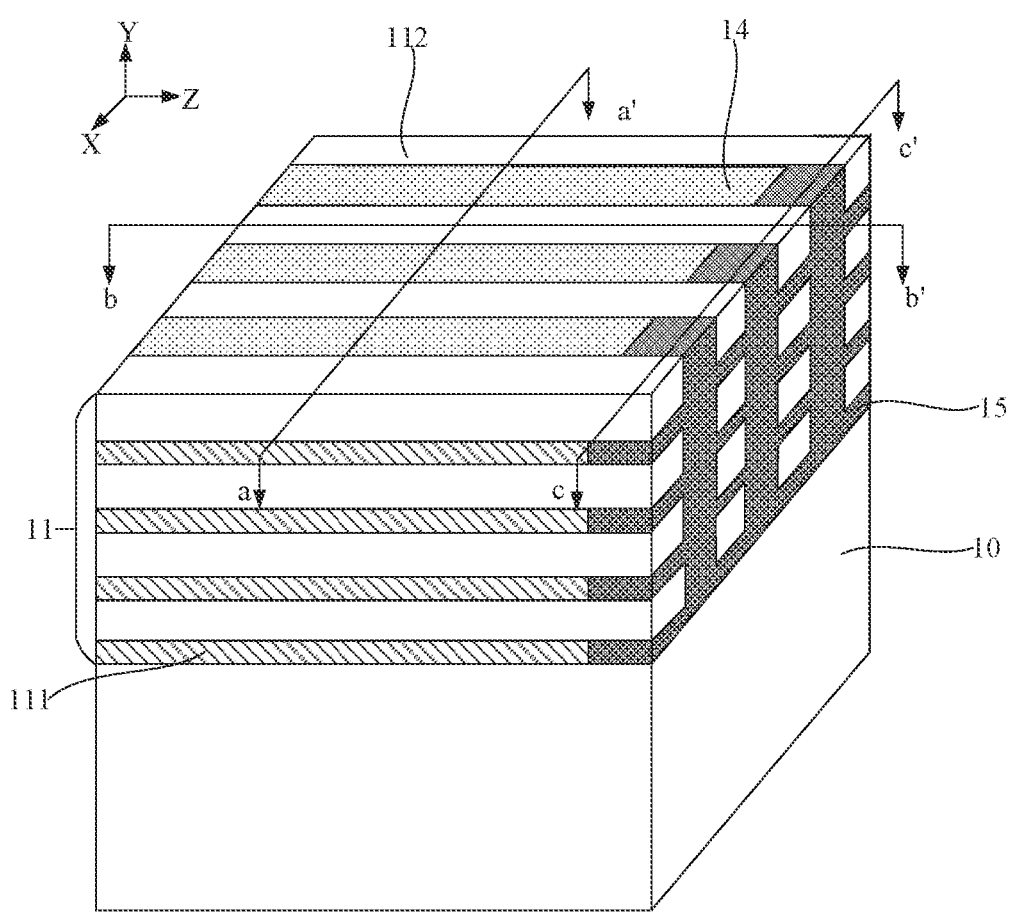
FIG. 2I is a ninth schematic structural diagram during forming a semiconductor structure provided by first embodiments of the present disclosure.
Figure 2J:
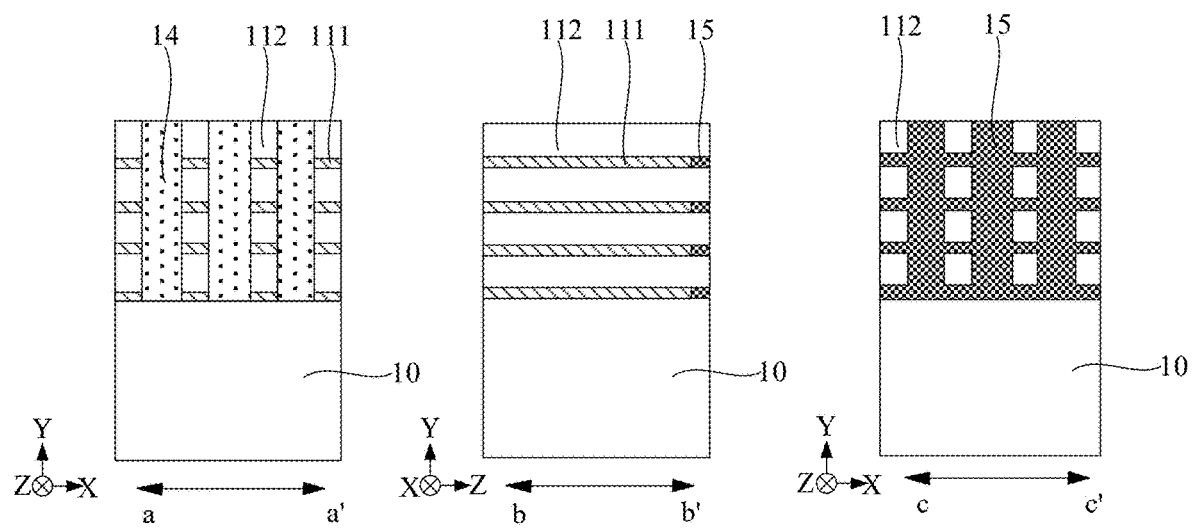
FIG. 2J is a tenth schematic structural diagram during forming a semiconductor structure provided by first embodiments of the present disclosure.

Next, referring to FIG. 2G to FIG. 2J, S102 is performed. A support structure is formed in the stack structures and the isolation structures. FIG. 2G and FIG. 2I are three-dimensional views, and FIG. 2H and FIG. 2J are the sectional views of the FIG. 2G and FIG. 2I, respectively.

In some embodiments, the support structure 15 may be formed by the following operations. A second mask layer (not shown) with a second preset pattern is formed on the surfaces of the stack structures 11 and the isolation structures 14. The second preset pattern exposes part of each of the stack structures 11 and part of each of the isolation structures 14. The exposed isolation structures 14 and the first semiconductor layers 111 of the exposed stack structures 11 are etched to be removed by the second mask layer to form etching grooves 16 as shown in FIG. 2G and FIG. 2H. A support material is filled in the etching grooves 16 to form the support structure 15 as shown in FIG. 2I and FIG. 2J. In the embodiments of the disclosure, the support material may be silicon nitride or silicon carbonitride.

In some embodiments, after forming the etching grooves 16, the method for forming a semiconductor structure further includes: removing the second mask layer having the second preset pattern. During implementation, the second mask layer may be removed by a dry etching technology or a wet etching technology to expose the top surfaces of the isolation structures 14.

In the embodiments of the disclosure, since capacitor structures would be formed in the interspace between the second semiconductor layers 112, the support structure 15 can also be used to support the capacitor structures, thereby improving the stack stability of capacitor structures.

Figure 2K:
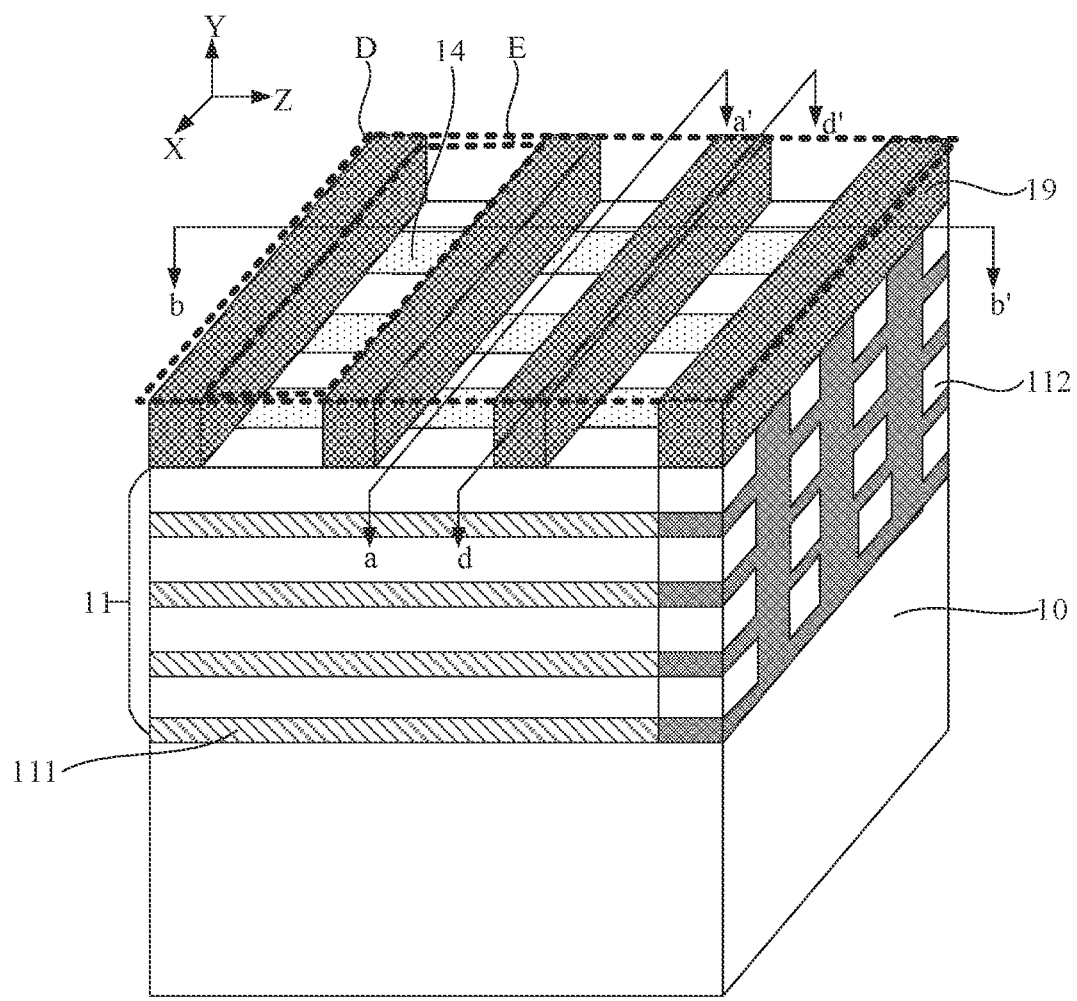
FIG. 2K is an eleventh schematic structural diagram during forming a semiconductor structure provided by first embodiments of the present disclosure.
Figure 2L:
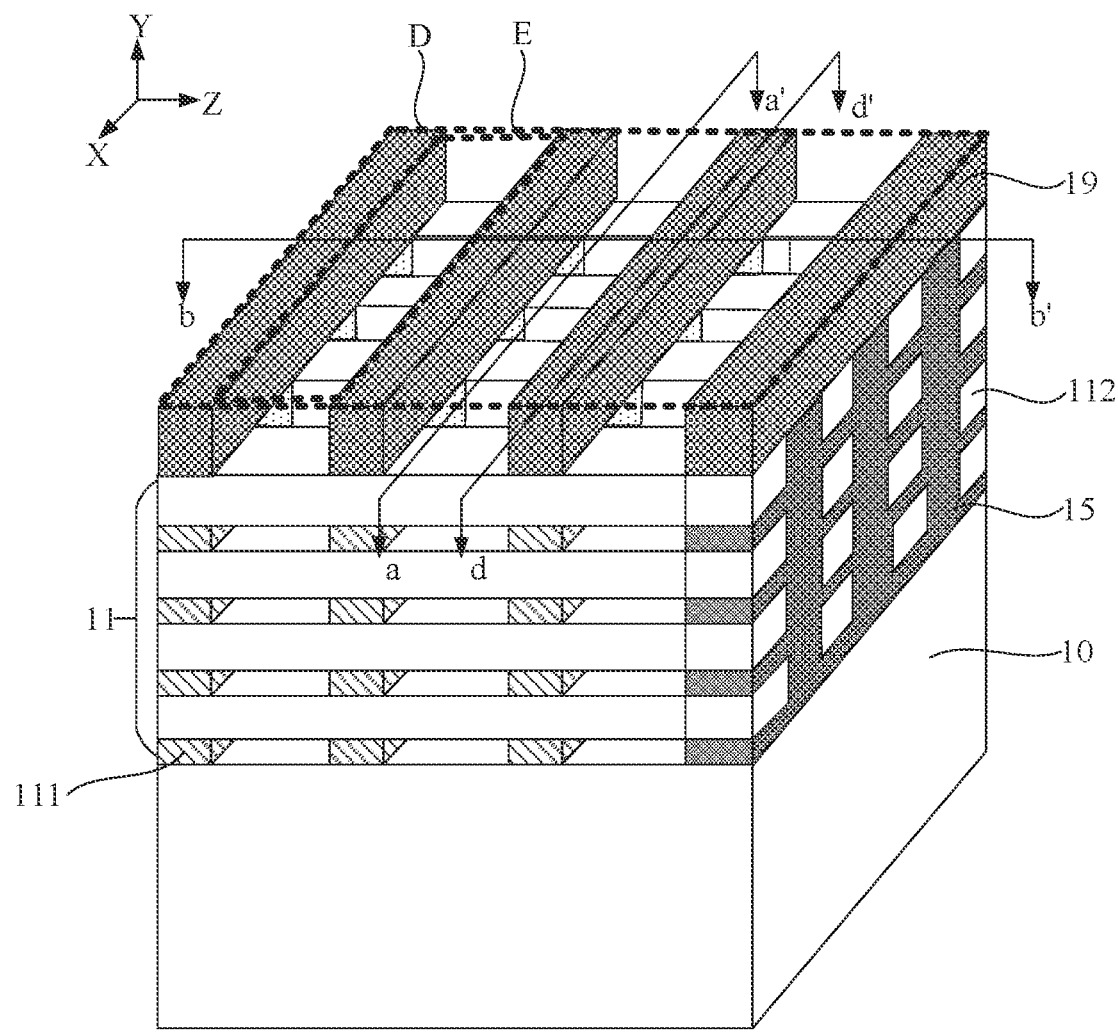
FIG. 2L is a twelfth schematic structural diagram during forming a semiconductor structure provided by first embodiments of the present disclosure.
Figure 2M:
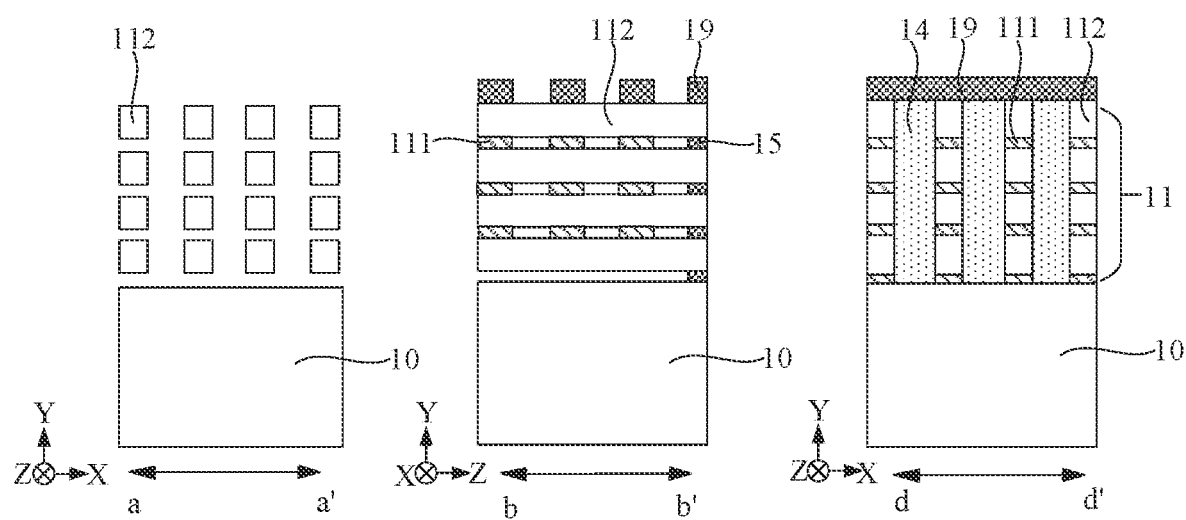
FIG. 2M is a thirteenth schematic structural diagram during forming a semiconductor structure provided by first embodiments of the present disclosure.
Figure 2N:
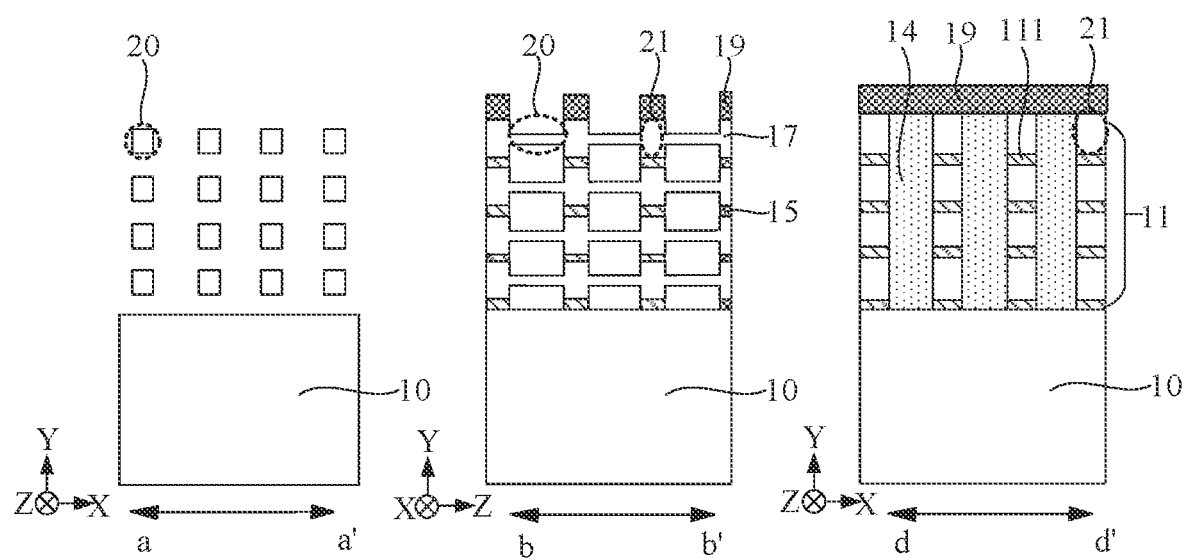
FIG. 2N is a fourteenth schematic structural diagram during forming a semiconductor structure provided by first embodiments of the present disclosure.
Figure 2O:
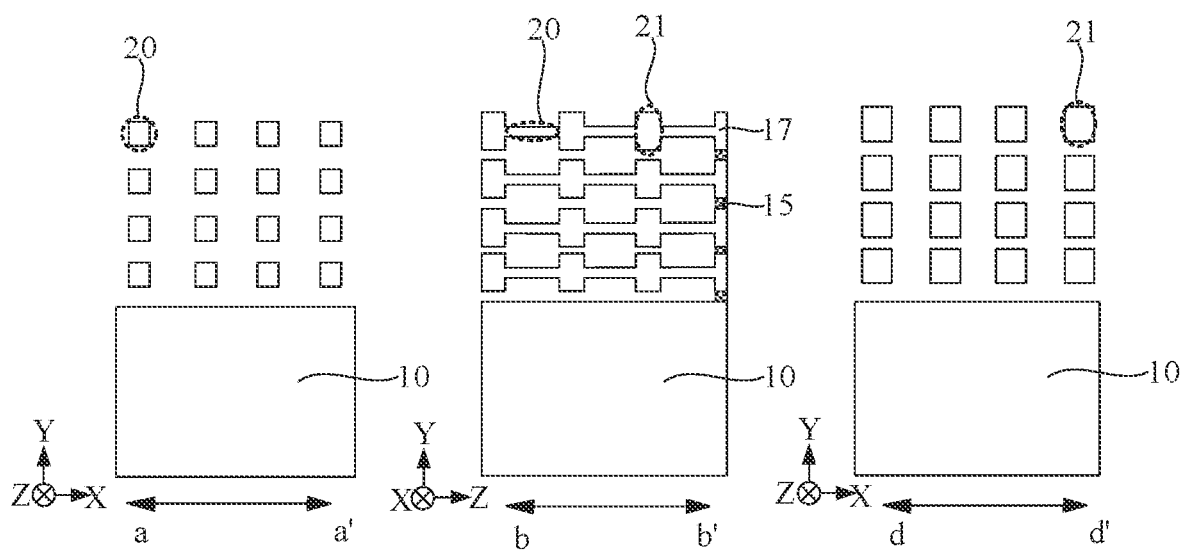
FIG. 2O is a fifteenth schematic structural diagram during forming a semiconductor structure provided by first embodiments of the present disclosure.

Next, referring to FIG. 2K to FIG. 2O, S103 is performed. The stack structures 11 and the isolation structures 14 are etched to form a plurality of zigzag first semiconductor pillars 17 in an array arrangement along the first direction and a second direction, and interspaces are formed between the zigzag first semiconductor pillars. Each of the zigzag first semiconductor pillars 17 includes first convex structures 21 and first concave structures 20 alternately arranged along a third direction, and the zigzag first semiconductor pillars 17 are supported by the support structure 15. FIG. 2K and FIG. 2L are three-dimensional views, FIG. 2M is a sectional view of FIG. 2L, and FIG. 2N and FIG. 2O are sectional views.

In some embodiments, the zigzag first semiconductor pillars 17 may be formed by the following operations.

As shown in FIG. 2K, a mask layer 19 with a specific pattern D is formed on the surfaces of the stack structures 11 and the isolation structures 14. The specific pattern D includes a plurality of sub-patterns E arranged along Z-axis direction in sequence, and the sub-patterns E exposes part of each of the stack structures 11 and part of each of the isolation structures 14.

As shown in FIG. 2L and FIG. 2M, isolation structures 14 exposed by the sub-patterns E and first semiconductor layers 111 of the stack structures exposed by the sub-patterns E are removed by a dry etching technology or a wet etching technology. In the embodiments of the disclosure, since the first semiconductor layers 111 have a higher etching selection ratio relative to the second semiconductor layers 112, the first semiconductor layers 111 can be removed without damaging the second semiconductor layers 112.

As shown in FIG. 2N, the second semiconductor layers 112 in the stack structures 11 exposed by the sub-patterns E are thinned to form first concave structures 20. Untreated parts of the second semiconductor layers 112 constitute the first convex structures 21, and a projection area of each of the first convex structures 21 on the Z-axis direction is greater than a projection area of each of the first concave structures 20 on the Z-axis direction.

As shown by FIG. 2O, after forming the first concave structures 20, the method for forming a semiconductor structure further includes: removing the mask layer 19, the remaining first semiconductor layers 111 and the remaining isolation structures 14 to expose the first convex structures 21.

In some embodiments, after forming the zigzag first semiconductor pillars 17, the method for forming a semiconductor structure further includes: performing ion implantation on the zigzag first semiconductor pillars 17. For example, metal ions, e.g. sodium ions, may be used for performing ion implantation on the zigzag first semiconductor pillars 17. Since the zigzag first semiconductor pillar 17 would act as a part of the lower electrode of the capacitor structure, the contact resistance between the lower electrode and the drain can be reduced by performing ion implantation on the zigzag first semiconductor pillar 17, thereby reducing the power consumption of the semiconductor structure.

In some embodiments, after performing ion implantation on the zigzag first semiconductor pillars 17, the method for forming a semiconductor structure further includes: forming a metal silicide on the surfaces of the zigzag first semiconductor pillars 17. During implementation, a layer of metal material, which may be, for example, any one of cobalt (Co), titanium (Ti), tantalum (Ta), nickel (Ni), tungsten (W), platinum (Pt), or palladium (Pd), may be deposited on the zigzag first semiconductor pillars 17. After that, the metal material reacts with the zigzag first semiconductor pillars 17 by a rapid thermal annealing treatment, thereby forming the metal silicide on the surfaces of the zigzag first semiconductor pillars 17. Because the metal silicide has a low resistance value, the contact resistance between the lower electrode and the drain can be reduced, thereby reducing the power consumption of the semiconductor structure.

Finally, referring to FIG. 2P to FIG. 2S, S104 is performed, and capacitor structures 22 are formed in an interspace.

Figure 2P:
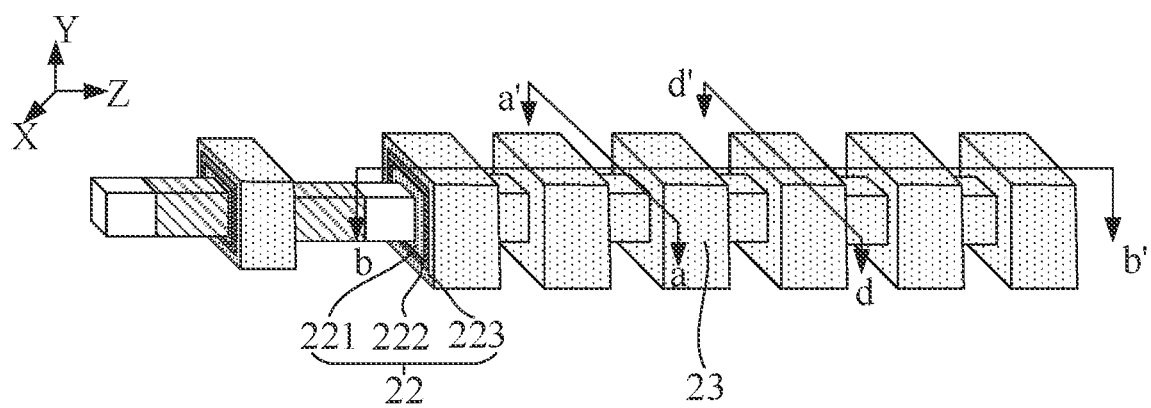
FIG. 2P is a sixteenth schematic structural diagram during forming a semiconductor structure provided by first embodiments of the present disclosure.
Figure 2Q:
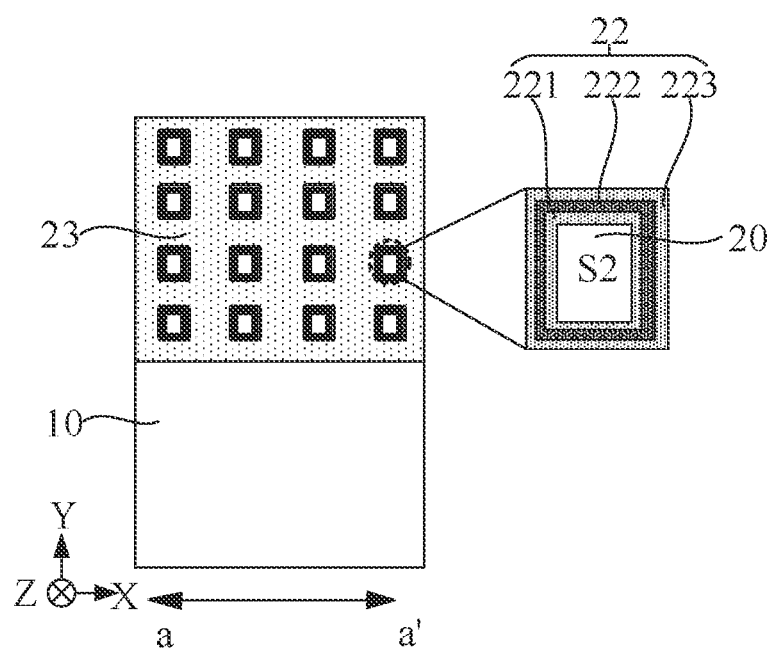
FIG. 2Q is a seventeenth schematic structural diagram during forming a semiconductor structure provided by first embodiments of the present disclosure.
Figure 2R:
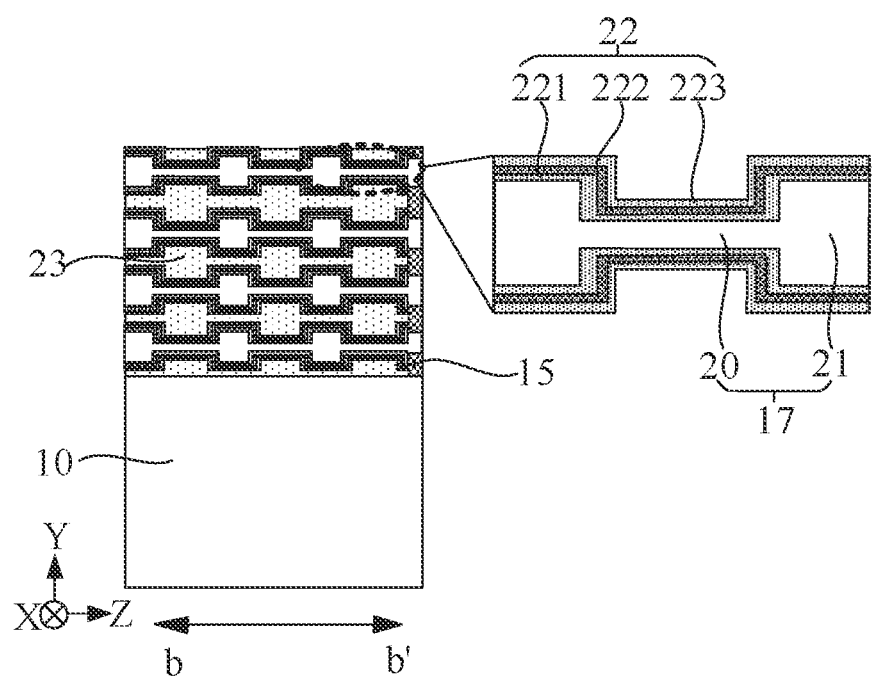
FIG. 2R is an eighteenth schematic structural diagram during forming a semiconductor structure provided by first embodiments of the present disclosure.
Figure 2S:
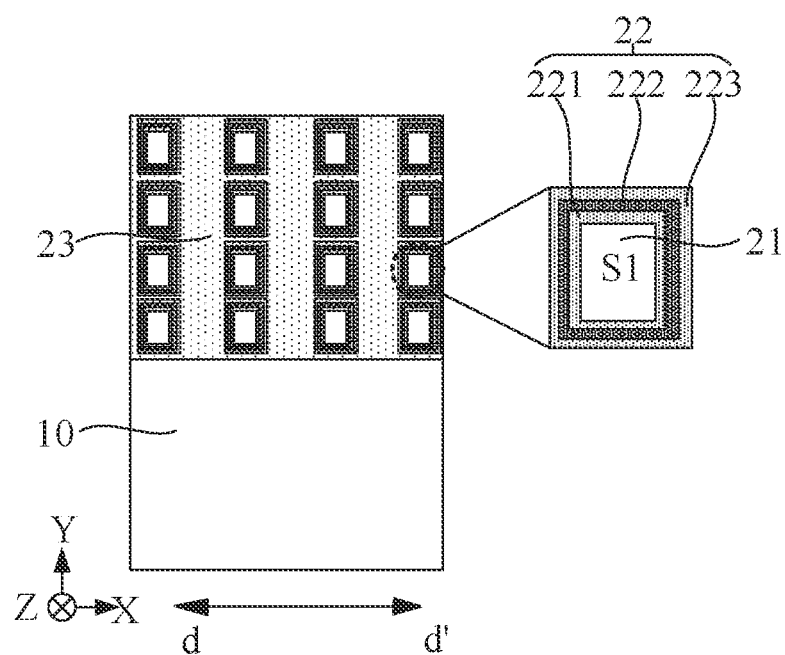
FIG. 2S is a nineteenth schematic structural diagram during forming a semiconductor structure provided by first embodiments of the present disclosure.

FIG. 2P is a three-dimensional view, FIG. 2Q, FIG. 2R and FIG. 2S are sectional views along a-a', b-b' and d-d' in FIG. 2P, respectively. It should be noted that the three-dimensional view of only one zigzag first semiconductor pillar 17 is shown in FIG. 2P. Actually, the semiconductor structure includes a plurality of zigzag first semiconductor pillars in an array arrangement along X-axis and Y-axis directions.

As shown in FIG. 2P to FIG. 2S, in some embodiments, the capacitor structures 22 may be formed by the following operations. A first electrode layer material, a dielectric layer material and a second electrode layer material are deposited in the interspace between the zigzag first electrode layers 17 in sequence to form a first electrode layer 221, a dielectric layer 222, and a second electrode layer 223, to form each of the capacitor structures 22.

In the embodiments of the disclosure, the first electrode material, the dielectric material, and the second electrode material may be deposited by any one of a selective atomic layer deposition process, a chemical vapor deposition process, a physical vapor deposition process or a spin coating process. The first electrode material and the second electrode material may include a metal or a metal nitride, for example, ruthenium (Ru) or titanium nitride. The dielectric material may include a high-K dielectric material, for example, one or any combination of lanthanum oxide ($La_2O_3$), alumina ($Al_2O_3$), hafnium oxide ($HfO_2$), hafnium oxynitride (HfON), hafnium silicate (HfSiOx) or zirconia ($ZrO)_2$). In other embodiments, the first electrode material and the second electrode material may also be polysilicon.

In some embodiments, referring to FIG. 2P to FIG. 2S, the method for forming a semiconductor structure further includes: filling a conducting material in an interspace between second electrode layers 223 to form a conducting layer 23. In the embodiments of the disclosure, the conducting material may be polysilicon or any other suitable conducting materials, for example, germanium silicon or doped polysilicon.

In the embodiments of the disclosure, the first convex structures 21 and the first concave structures 20 together constitute the zigzag first semiconductor pillars 17, and the capacitor structures are formed subsequently in the interspace between the zigzag first semiconductor pillars 17. Since the projection area 51 of each of the first convex structures 21 on the third direction is greater than the projection area S2 of each of the first concave structures 20 on the third direction, the surface area of each of the zigzag first semiconductor pillars 17 in the embodiments of the disclosure is larger than the surface area of the cylindrical semiconductor pillar in some implementations, and thus the effective area between the electrodes of each of the formed capacitor structures is larger and each of the formed capacitor structures has high capacitance. As a result, the sensing effect of the sense amplifier can be improved, and the retention time of data can be increased.

In some embodiments, the first convex structures 21 and the first concaves structure 20 are cuboids. A cross-section of the first concave structures 20 perpendicular to Z axis is a square with a side length of A, a cross-section of the first convex structures 21 perpendicular to the Z axis is a square with a side length of B, and the first convex structures 21 and the first concave structures 20 in the Z-axis direction have a length of L. A, B and L conform to the equation: $4L<B+A$, in which $B>A$.

In some embodiments, the range of A may be 10 to 30 nm, and the range of B may be 30 to 50 nm, and the range of L may be 5 nm to 20 nm.

In some embodiments, before forming the capacitor structures, the method for forming a semiconductor structure further includes: forming a gate-all-around structure and a bit line structure.

Figure 3A:
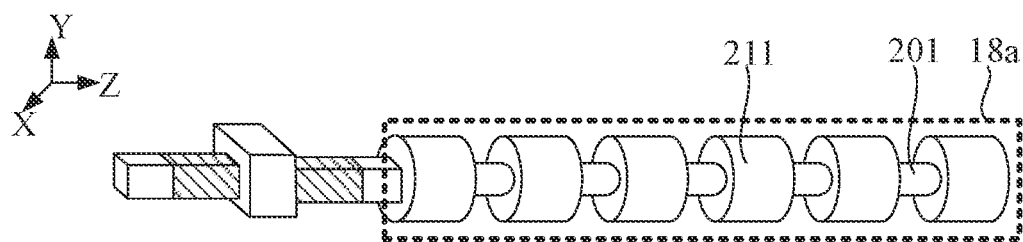
FIG. 3A is a first schematic structural diagram during forming a semiconductor structure provided by second embodiments of the present disclosure.

In some embodiments, as shown in FIG. 3A, after forming the first concave structures 20, the method for forming a semiconductor structure further includes: rounding the first concave structures 20 to form first cylinders 201. For example, the first concave structures 20 can be etched with a tetramethylammonium hydroxide (TMAH) solution to form the first cylinders 201.

In some embodiments, after forming the first cylinders, the method for forming a semiconductor structure further includes: etching the first convex structures 21 with the TMAH solution to round the first convex structures 21 to form second cylinders 211. The first cylinders 201 and the second cylinders 211 together constitute zigzag second semiconductor pillars 18a.

In some embodiments, before rounding the first convex structures 21, it is necessary to form a shielding layer on the surfaces of the first cylinders 201. The shielding layer has a different etching selection ratio with the zigzag second semiconductor pillars 18a and is used for protecting the first cylinders 201 from being damaged when the first convex structures 21 are rounded. For example, the material of the shielding layer may be silicon dioxide, silicon nitride, silicon carbonitride, silicon hydroxide, or the like. In the embodiments of the disclosure, in the process of rounding the first concave structures 20, since the isolation structures 14 and the mask layer 19 are retained around the first convex structures 21, the first convex structures 21 can be protected from being damaged, so there is no need to form the shielding layer on the surfaces of the first convex structures 21.

In some embodiments, after forming the zigzag second semiconductor pillars 18a, the method for forming a semiconductor structure further includes: performing ion implantation on the each zigzag second semiconductor pillars 18a, or forming the metal silicide on the surfaces of each zigzag second semiconductor pillars 18a. For example, the metal ions (e.g. sodium ions) may be used for performing ion implantation on the zigzag second semiconductor pillars 18a.

In the embodiments of the disclosure, since the zigzag second semiconductor pillar 18a would act as a part of the lower electrode of the capacitor structure, the contact resistance between the lower electrode and the drain can be reduced by performing metal ion implantation on the zigzag second semiconductor pillar 18a, thereby reducing the power consumption of the semiconductor structure.

Figure 3B:
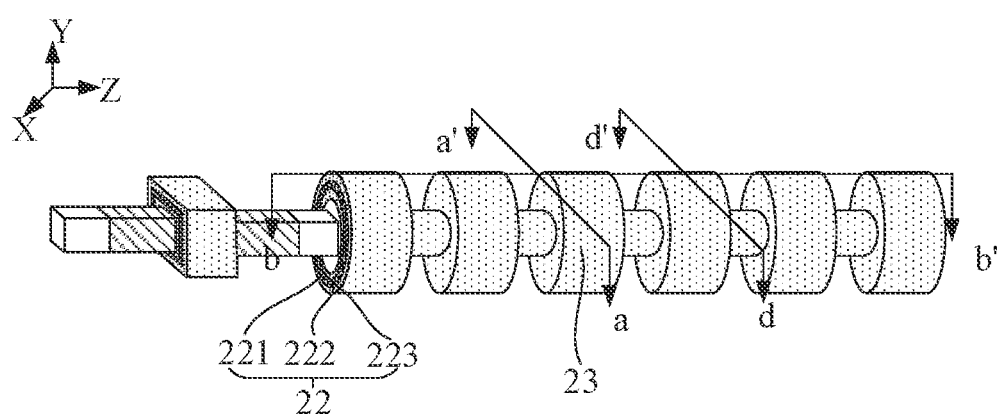
FIG. 3B is a second schematic structural diagram during forming a semiconductor structure provided by second embodiments of the present disclosure.
Figure 3C:
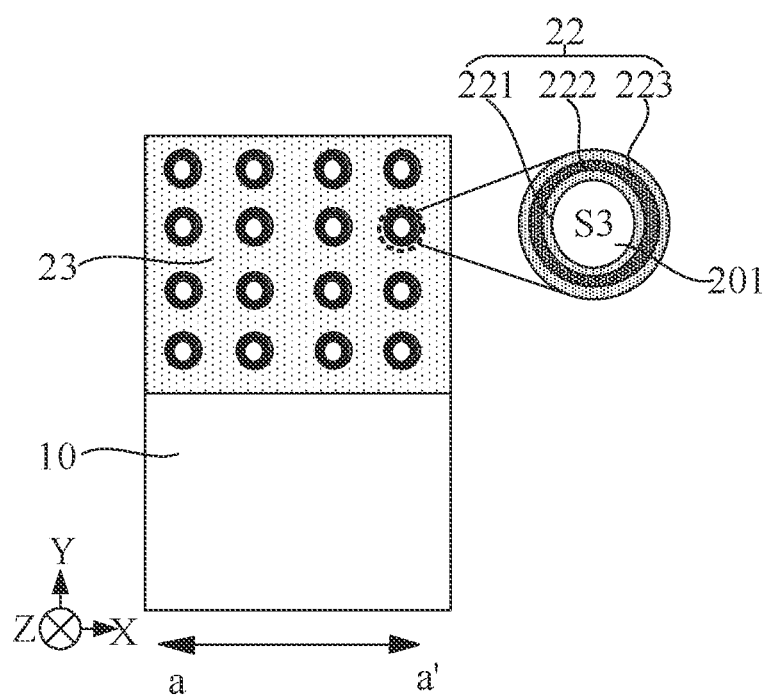
FIG. 3C is a third schematic structural diagram during forming a semiconductor structure provided by second embodiments of the present disclosure.
Figure 3D:
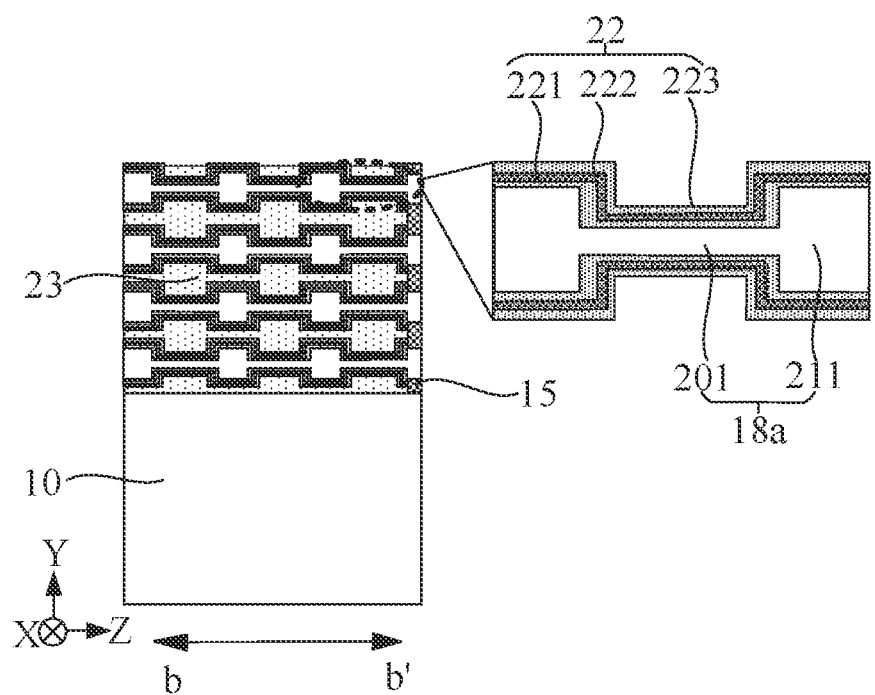
FIG. 3D is a fourth schematic structural diagram during forming a semiconductor structure provided by second embodiments of the present disclosure.
Figure 3E:
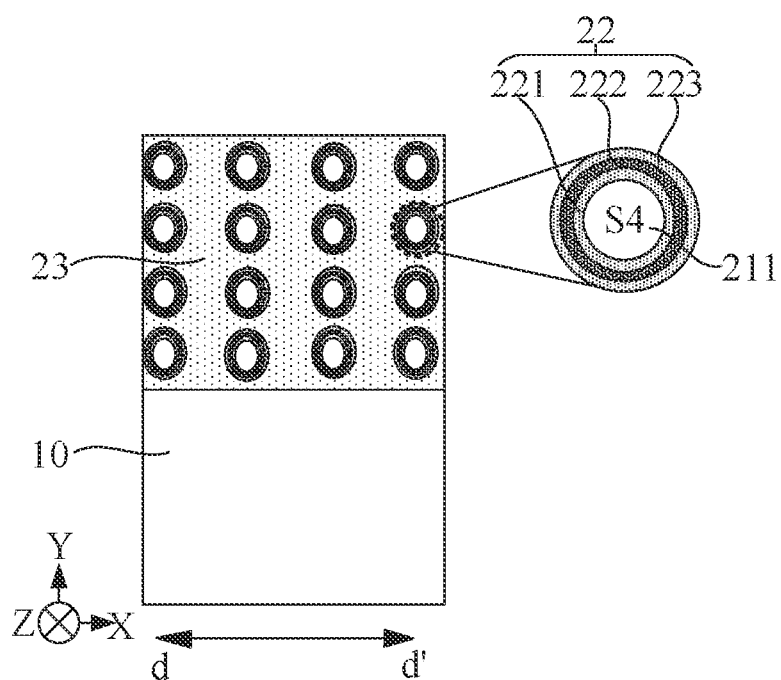
FIG. 3E is a fifth schematic structural diagram during forming a semiconductor structure provided by second embodiments of the present disclosure.

In some embodiments, after performing ion implantation on the zigzag second semiconductor pillars 18a, or after forming the metal silicide on the surfaces of the zigzag second semiconductor pillars 18a, the method for forming a semiconductor structure further includes: forming a first electrode layer 221, a dielectric layer 222 and a second electrode layer in sequence in the interspace between the zigzag second semiconductor pillars 18a to form each of capacitor structures 22 as shown in FIG. 3B to FIG. 3E. FIG. 3B is a three-dimensional view, and FIG. 3C, FIG. 3D and FIG. 3E are the sectional views along a-a', b-b' and d-d' in FIG. 3B, respectively. It should be noted that the three-dimensional view of only one zigzag second semiconductor pillar 18a is shown in FIG. 3B. Actually, the semiconductor structure includes a plurality of zigzag second semiconductor pillars 18a in an array arrangement along X-axis and Y-axis directions.

In some embodiments, referring to FIG. 3B to FIG. 3E, the method for forming a semiconductor structure further includes: filling a conducting material in the interspace between second electrode layers 223 to form a conducting layer 23.

In the embodiments of the disclosure, the first cylinders 201 and the second cylinders 211 together constitute each of the zigzag second semiconductor pillars 18a, and the capacitor structures are formed subsequently in the interspace between the zigzag second semiconductor pillars 18a. Since the projection area S4 of each second cylinder 211 on the third direction is greater than the projection area S3 of each first cylinder 201 on the third direction, the surface area of the zigzag second semiconductor pillar 18a in the embodiments of the disclosure is larger than the surface area of the cylindrical semiconductor pillar in some implementations, and thus the effective area between the electrodes of each of the formed capacitor structures is larger and each of the formed capacitor structures has high capacitance. As a result, the sensing effect of the sense amplifier can be improved, and the retention time of data can be increased In some embodiments, the first cylinders 201 and the second cylinders 211 are cylinders. A cross-section of the first cylinders 201 perpendicular to Z axis is a circle with a radius of r, a cross-section of the second cylinders 211 perpendicular to Z axis is a circle with a radius of R, the first cylinders 201 and the second cylinders 211 in the Z-axis direction have a length of L, and r, R, L conform to the equation: $2L<r+R$, in which R is greater than r.

In some embodiments, the range of r may be 5 to 15 nm, and the range of R may be 15 to 30 nm, and the range of L may be 5 nm to 20 nm.

Figure 4A:
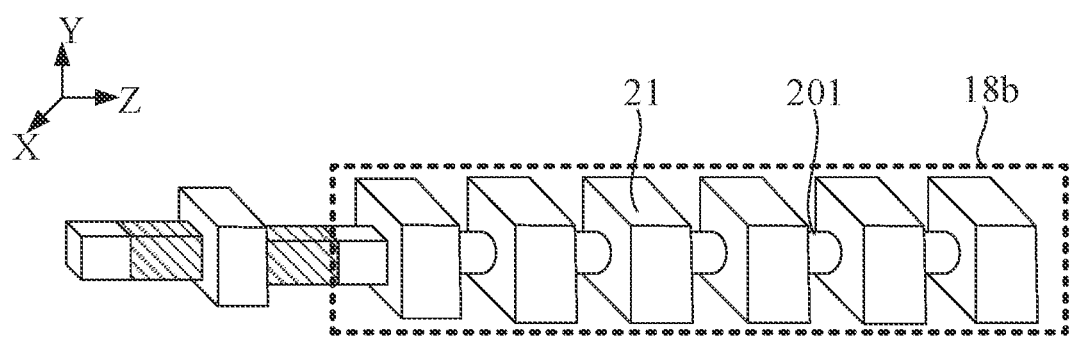
FIG. 4A is a first schematic structural diagram during forming a semiconductor structure provided by third embodiments of the present disclosure.

In some embodiments, as shown in FIG. 4A, after forming the first concave structures 20, the method for forming a semiconductor structure further includes: rounding the first concave structures 20 to form the first cylinders 201. For example, the first concave structures 2O may be etched with the TMAH solution to form the first cylinders 201. The first cylinders 201 and the first convex structure 21 together constitute zigzag third semiconductor pillars 18b.

In some embodiments, after forming the zigzag third semiconductor pillars 18b, the method for forming a semiconductor structure further includes: performing ion implantation on the zigzag third semiconductor pillars 18b, or forming the metal silicide on the surfaces of the zigzag third semiconductor pillars 18b. For example, metal ions (e.g. sodium ions) may be used for performing ion implantation on the zigzag third semiconductor pillars 18b.

In the embodiments of the disclosure, since the zigzag third semiconductor pillar 18b would act as a part of the lower electrode of the capacitor structure, the contact resistance between the lower electrode and the drain can be reduced by performing metal ion implantation on the zigzag third semiconductor pillar 18b, thereby reducing the power consumption of the semiconductor structure.

Figure 4B:
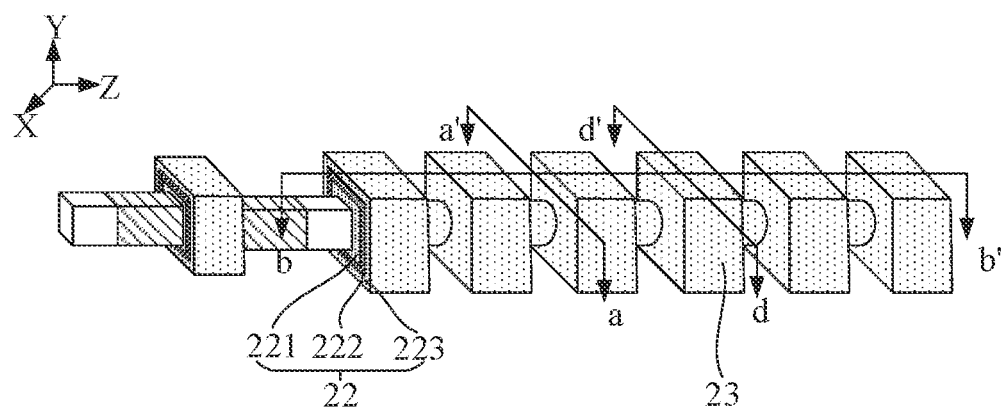
FIG. 4B is a second schematic structural diagram during forming a semiconductor structure provided by third embodiments of the present disclosure.
Figure 4C:
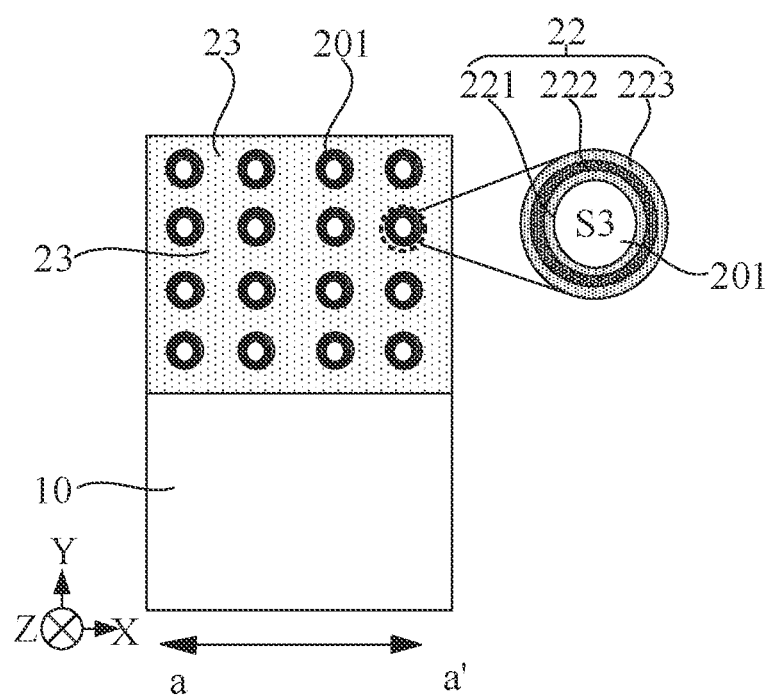
FIG. 4C is a third schematic structural diagram during forming a semiconductor structure provided by third embodiments of the present disclosure.
Figure 4D:
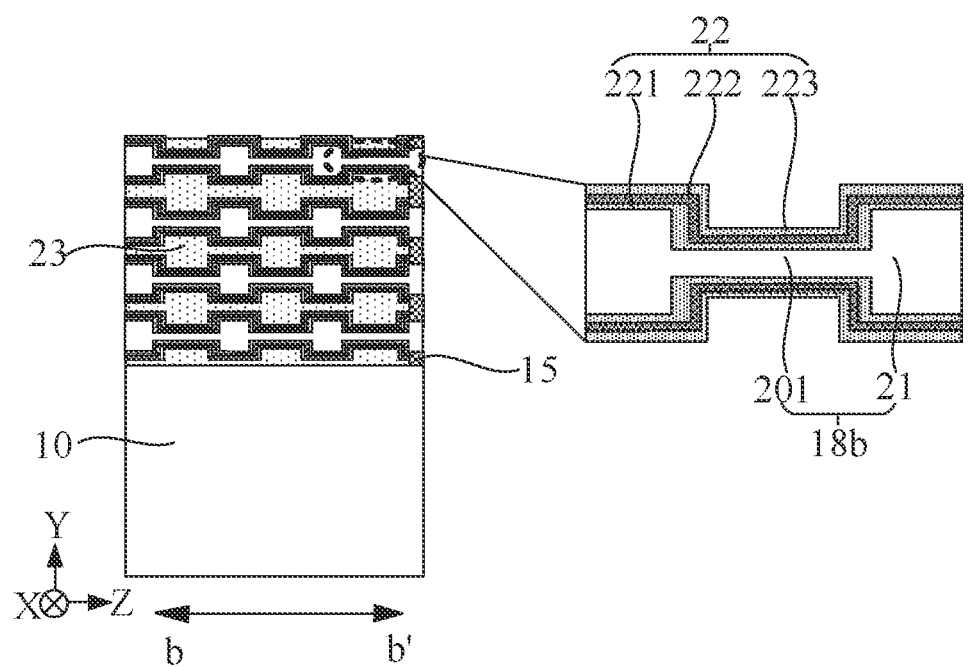
FIG. 4D is a fourth schematic structural diagram during forming a semiconductor structure provided by third embodiments of the present disclosure.
Figure 4E:
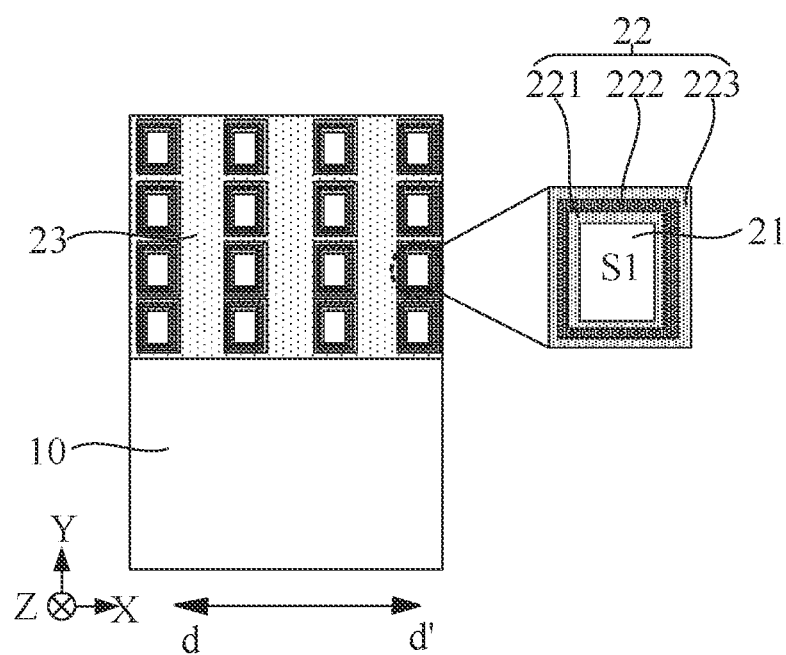
FIG. 4E is a fifth schematic structural diagram during forming a semiconductor structure provided by third embodiments of the present disclosure.

In some embodiments, after performing ion implantation on the zigzag third semiconductor pillars 18b, or forming the metal silicide on the surfaces of the zigzag third semiconductor pillars 18b, the method for forming a semiconductor structure further includes: forming a first electrode layer 221, a dielectric layer 222 and a second electrode layer in sequence in the interspace between the zigzag third semiconductor pillars 18b to form each of capacitor structures 22 as shown in FIG. 4B to FIG. 4E. FIG. 4B is a three-dimensional view, and FIG. 4C, FIG. 4D and FIG. 4E are the sectional views along a-a', b-b' and d-d' in FIG. 4B, respectively. It should be noted that the three-dimensional view of only one zigzag third semiconductor pillar 18b is shown in FIG. 4B. Actually, the semiconductor structure includes a plurality of zigzag third semiconductor pillars 18b in an array arrangement along X-axis and Y-axis directions.

In some embodiments, referring to FIG. 4B to FIG. 4E, the method for forming a semiconductor structure further includes: filling a conducting material in the interspace between the second electrode layers 223 to form a conducting layer 23.

In the embodiments of the disclosure, the first cylinders 201 and the first convex structures 21 together constitute the zigzag third semiconductor pillars 18b, and the capacitor structures are formed subsequently in the interspace between the zigzag third semiconductor pillars 18b. Since the projection area 51 of the first convex structure 21 along the third direction is greater than the projection area S3 of the first cylinder 201 along the third direction, the surface area of each of the zigzag third semiconductor pillars 18b in the embodiments of the disclosure is larger than the surface area of the cylindrical semiconductor pillar in some implementations, and thus the effective area between the electrodes of the each of formed capacitor structure is larger and each of the formed capacitor structures has high capacitance. As a result, the sensing effect of the sense amplifier can be improved, and the retention time of data can be increased.

Figure 5A:
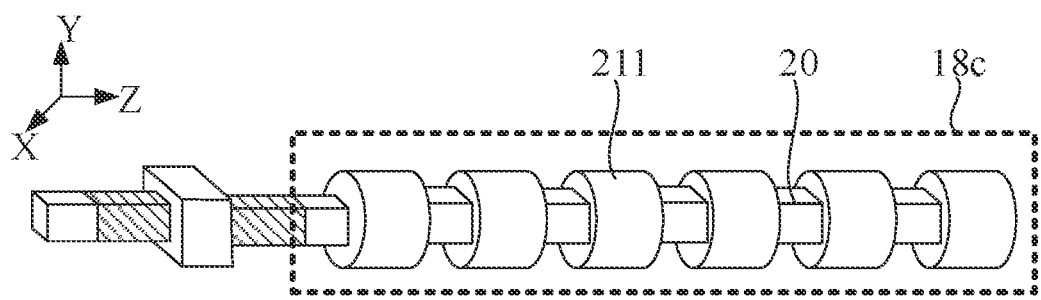
FIG. 5A is a first schematic structural diagram during forming a semiconductor structure provided by fourth embodiments of the present disclosure.

In some embodiments, as shown in FIG. 5A, after forming the first concave structures 20 and the first convex structures 21, the method for forming a semiconductor structure further includes: etching the first convex structures 21 by the TMAH solution to round the first convex structures 21 to form second cylinders 211. The first concave structures 20 and the second cylinders 211 together constitute zigzag fourth semiconductor pillars 18c.

In some embodiments, before rounding the first convex structures 21, it is necessary to form a shielding layer on the surfaces of the first cylinders 201. The shielding layer has a different etching selection ratio with the zigzag fourth semiconductor pillars 18c and is used for protecting the first cylinders 201 from being damaged when the first convex structures 21 are rounded. For example, the material of the shielding layer may be silicon dioxide, silicon nitride, silicon carbonitride, silicon hydroxide, or the like.

In some embodiments, after forming the zigzag fourth semiconductor pillars 18c, the method for forming a semiconductor structure further includes: performing ion implantation on the zigzag fourth semiconductor pillars 18c, or forming the metal silicide on the surfaces of the zigzag fourth semiconductor pillars 18c. For example, metal ions (e.g. sodium ions) may be used for performing ion implantation on the zigzag fourth semiconductor pillars 18c.

In the embodiments of the disclosure, since the zigzag fourth semiconductor pillar 18c would act as a part of the lower electrode of the capacitor structure, the contact resistance between the lower electrode and the drain can be reduced by performing metal ion implantation on the zigzag fourth semiconductor pillar 18c, thereby reducing the power consumption of the semiconductor structure.

Figure 5B:
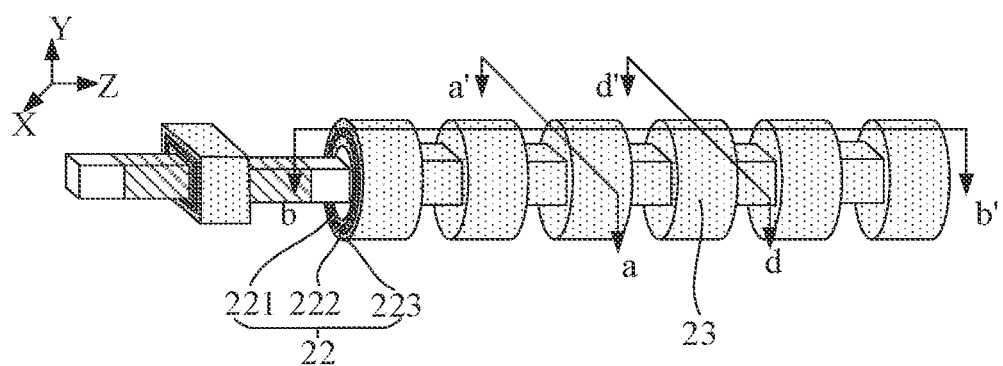
FIG. 5B is a second schematic structural diagram during forming a semiconductor structure provided by fourth embodiments of the present disclosure.
Figure 5C:
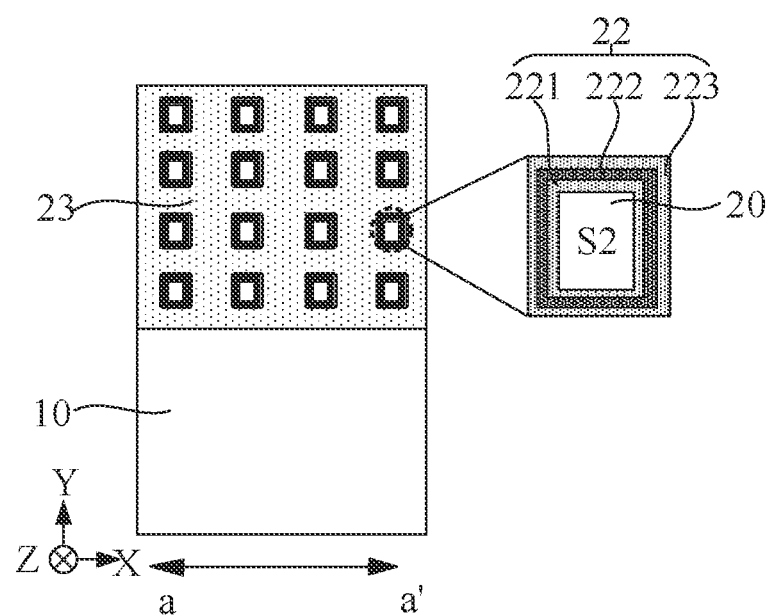
FIG. 5C is a third schematic structural diagram during forming a semiconductor structure provided by fourth embodiments of the present disclosure.
Figure 5D:
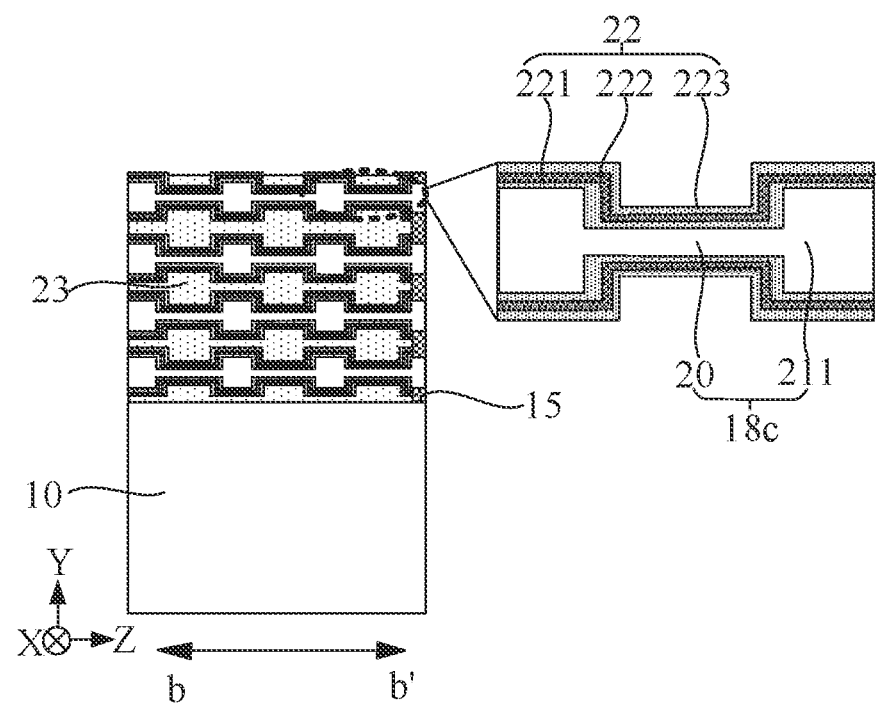
FIG. 5D is a fourth schematic structural diagram during forming a semiconductor structure provided by fourth embodiments of the present disclosure.
Figure 5E:
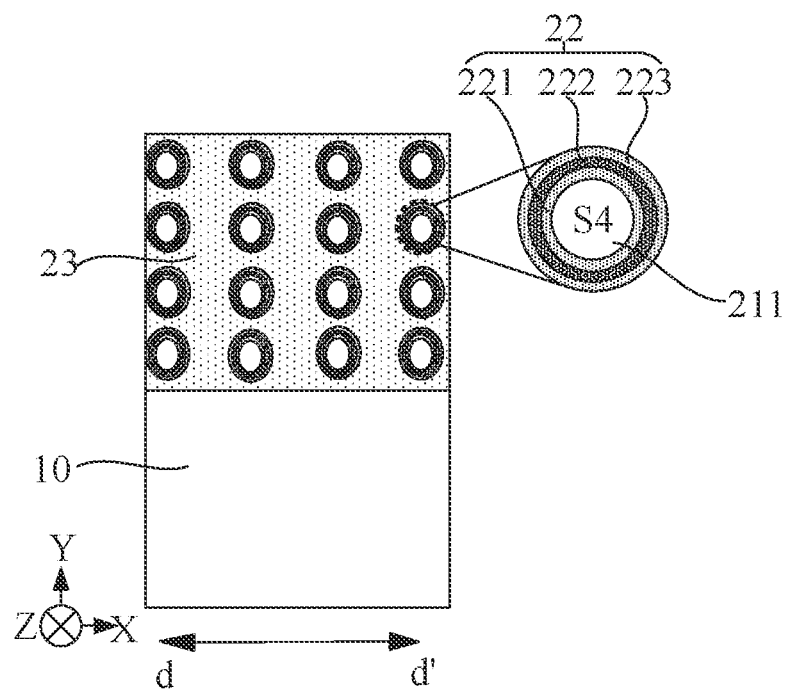
FIG. 5E is a fifth schematic structural diagram during forming a semiconductor structure provided by fourth embodiments of the present disclosure.

In some embodiments, after performing ion implantation on the zigzag fourth semiconductor pillars 18c, or after forming the metal silicide on the surfaces of the zigzag fourth semiconductor pillars 18c, the method for forming a semiconductor structure further includes: forming a first electrode layer 221, a dielectric layer 222 and a second electrode layer in sequence in the interspace between the zigzag fourth semiconductor pillars 18c to form each of the capacitor structures as shown in FIG. 5B to FIG. 5E. FIG. 5B is a three-dimensional view, and FIG. 5C, FIG. 5D and FIG. 5E are the sectional views along a-a', b-b' and d-d' in FIG. 5B, respectively. It should be noted that the three-dimensional view of only one zigzag fourth semiconductor pillar 18c is shown in FIG. 5B. Actually, the semiconductor structure includes a plurality of zigzag fourth semiconductor pillar 18c in an array arrangement along X-axis and Y-axis directions.

In some embodiments, referring to FIG. 5B to FIG. 5E, the method for forming a semiconductor structure further includes: filling a conducting material in the interspace between second electrode layers 223 to form a conducting layer 23.

In the embodiments of the disclosure, the first concave structures 20 and the second cylinders 211 together constitute the zigzag fourth semiconductor pillars 18c, and the capacitor structures are formed subsequently in the interspace between the zigzag fourth semiconductor pillars 18c. Since the projection area S4 of each of the second cylinders 211 along the third direction is greater than the projection area S2 of each of the first concave structures 20 along the third direction, the surface area of each of the zigzag fourth semiconductor pillars 18c in the embodiments of the disclosure is larger than the surface area of the cylindrical semiconductor pillar in some implementations, and thus the effective area between the electrodes of each of the formed capacitor structures is larger and each of the formed capacitor structures has high capacitance. As a result, the sensing effect of the sense amplifier can be improved, and the retention time of data can be increased.

Figure 6A:
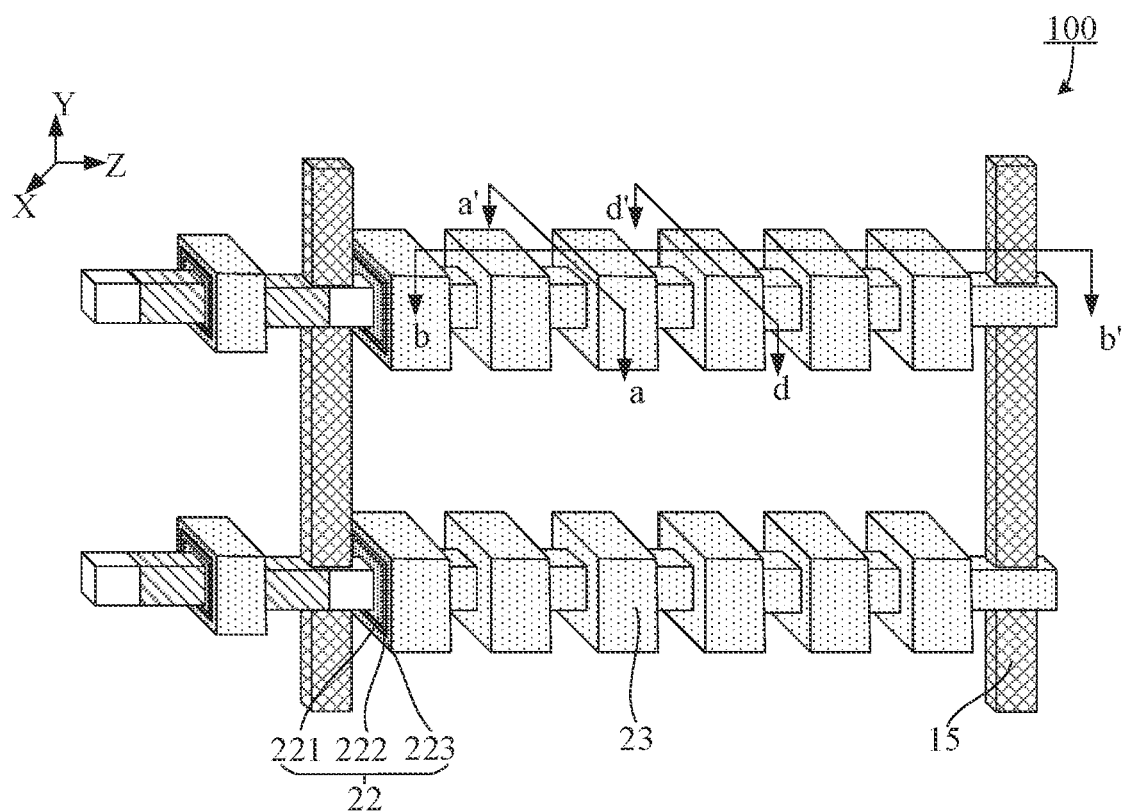
FIG. 6A is a first schematic structural diagram of a semiconductor structure provided by fifth embodiments of the disclosure.
Figure 6B:
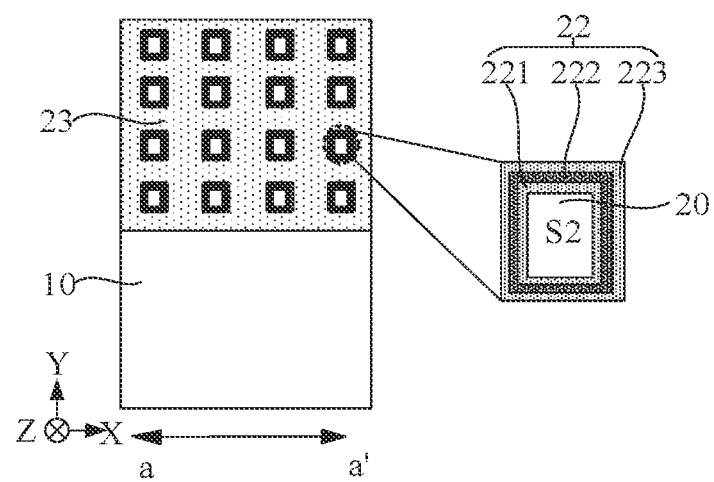
FIG. 6B is a second schematic structural diagram of a semiconductor structure provided by fifth embodiments of the disclosure.
Figure 6C:
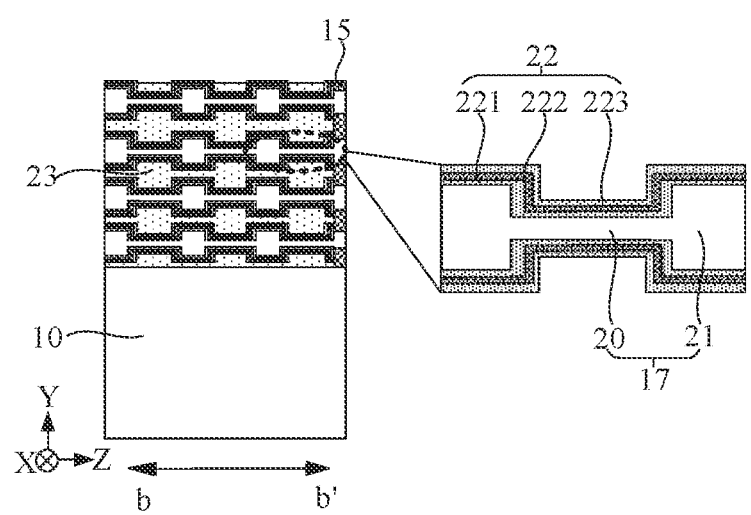
FIG. 6C is a third schematic structural diagram of a semiconductor structure provided by fifth embodiments of the disclosure.
Figure 6D:
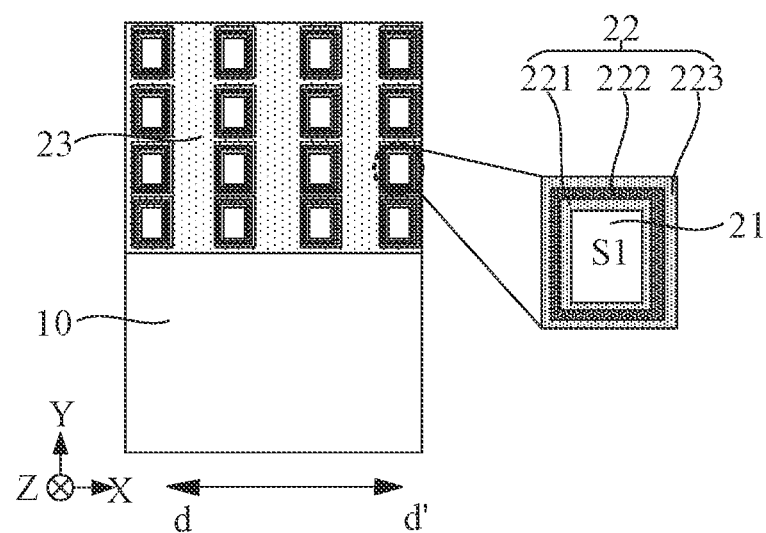
FIG. 6D is a fourth schematic structural diagram of a semiconductor structure provided by fifth embodiments of the disclosure.

In addition, embodiments of the disclosure also provide a semiconductor structure, and the semiconductor structure is formed by the method for forming a semiconductor structure in the above embodiments, and FIG. 6A to 6D are schematic structural diagrams of the semiconductor structure provided by the embodiments of the disclosure. FIG. 6A is a three-dimensional view of part of the semiconductor structure, and FIG. 6B to FIG. 6D are the sectional views along a-a', b-b', and d-d' in FIG. 6A. The semiconductor structure 100 includes a semiconductor substrate 10, and a support structure 15 and a plurality of zigzag first semiconductor pillars 17 located on a surface of the semiconductor substrate 10.

The plurality of zigzag first semiconductor pillars 17 are in an array arrangement along a first direction (i.e., X-axis direction) and a second direction (i.e., Y-axis direction), and the plurality of zigzag first semiconductor pillars 17 are supported by the support structure 15. Each of the zigzag first semiconductor pillars 17 includes first convex structures 21 and first concave structures 20 arranged alternately along a third direction (i.e., Z-axis direction).

In the embodiments of the disclosure, a projection area S1 of each of the first convex structures 21 along the Z-axis direction is greater than a projection area S2 of each of the first concave structures 20 along the Z-axis direction.

In some embodiments, each of the first convex structures 21 may be a square pillar, a polygon pillar, or a circular pillar, and each of the first concave structures 20 may be a square pillar, a polygon pillar, or a circular pillar.

In some embodiments, referring to FIG. 6A to FIG. 6D, the semiconductor structure 100 further include: capacitor structures 22 filled between the zigzag first semiconductor pillars 17. Each of the capacitor structures 22 includes a first electrode layer 221, a dielectric layer 222 and a second electrode layer 223.

In some embodiments, the semiconductor structure 100 further includes: a conducting layer 23 filled between second electrode layers 223.

The semiconductor structure provided by the embodiments of the disclosure is similar to the method for forming a semiconductor structure in the above-mentioned embodiments. For technical features not disclosed in detail in the embodiments of the disclosure, please refer to the above-mentioned embodiment for understanding, and it will not be repeated here.

In the embodiments of the disclosure, since the capacitor structures in the semiconductor structure are zigzag, the effective area between the electrodes of each of the capacitor structures is greater and each of the capacitor structures has high capacitance. In this way, the sensing effect of the sense amplifier can be improved, and the retention time of data can be increased.

In several embodiments provided by the disclosure, it should be understood that the disclosed devices and methods may be implemented in a non-target way. The above-described structure embodiments are only illustrative. For example, the division of the units is only a logical function division, and there may be other division modes during actual implementation, such as, multiple units or components may be combined or integrated into another system, or some features may be ignored or not executed. In addition, the various parts shown or discussed are coupled, or directly coupled to each other.

The features disclosed in several method or device embodiments provided by the disclosure may be arbitrarily combined without conflict to obtain a new method embodiment or device embodiment.

The above are only some embodiments of the disclosure, and the protection scope of the disclosure is not limited to this. Changes or replacements can be easily thought of by any person skilled in the art and such changes or replacements should be covered by the protection scope of the disclosure. Therefore, the protection scope of the disclosure should be subject to the protection scope of the claims.

According to a semiconductor structure and a method for forming a semiconductor structure provided by embodiments of the disclosure, since capacitor structures are formed in an interspace between zigzag first semiconductor pillars and each of the zigzag first semiconductor pillars has a greater surface area, an effective area between electrodes of each of the formed capacitor structures is greater and each of the formed capacitor structures has high capacitance. In this way, the sensing effect of the sense amplifier can be improved, and the retention time of data can be increased.

What is claimed is:

1. A method for forming a semiconductor structure, comprising:
   providing a semiconductor substrate, wherein stack structures and isolation structures alternately arranged along a first direction are formed on the semiconductor substrate, and each of the stack structures comprises first semiconductor layers and second semiconductor layers alternately stacked along a second direction;
   forming a support structure in the stack structures and the isolation structures;
   etching the stack structures and the isolation structures to form a plurality of zigzag first semiconductor pillars in an array arrangement along the first direction and the second direction, wherein an interspace is formed between the zigzag first semiconductor pillars, wherein the zigzag first semiconductor pillars are formed by:
   forming a mask layer with a specific pattern on surfaces of the stack structures and the isolation structures, wherein the specific pattern comprises a plurality of sub-patterns arranged along a third direction in sequence, and the sub-patterns exposes part of each of the stack structures and part of each of the isolation structures; and
   forming first concave structures by thinning each of the second semiconductor layers in each of the stack structures exposed by the sub-patterns; wherein an untreated part of each of the second semiconductor layers constitutes first convex structures; and a projection area of each of the first convex structures along the third direction is greater than a projection area of each of the first concave structures along the third direction;
   each of the zigzag first semiconductor pillars comprises the first convex structures and the first concave structures alternately arranged along the third direction, and the zigzag first semiconductor pillars are supported by the support structure; the first direction, the second direction and the third direction are perpendicular to one another, and the second direction is perpendicular to a top surface of the semiconductor substrate; and
   forming capacitor structures in the interspace.

2. The method according to claim 1, wherein before forming the first concave structures, the method further comprises:
   removing the isolation structures exposed by the sub-patterns and the first semiconductor layers of the stack structures exposed by the sub-patterns by using the mask layer.

3. The method according to claim 2, wherein after forming the first concave structures, the method further comprises:
   removing the mask layer, the remaining first semiconductor layers and the remaining isolation structures in sequence.

4. The method according to claim 1, wherein the stack structures and the isolation structures are formed by:
   forming an initial stack structure on the semiconductor substrate, wherein the initial stack structure comprises the first semiconductor layers and the second semiconductor layers alternately stacked;
   patterning the initial stack structure to form the stack structures and isolation trenches; and
   filling an isolation material in the isolation trenches to form the isolation structures.

5. The method according to claim 4, wherein patterning the initial stack structure to form the stack structures and the isolation trenches comprises:
   forming a first mask layer having a first preset pattern on a surface of the initial stack structure, wherein the first preset pattern comprises a plurality of first preset sub-patterns arranged along the first direction in sequence and the first preset pattern exposes part of the initial stack structure; and
   etching the initial stack structure by the first mask layer to remove the initial stack structure exposed by the first preset sub-patterns, to form the stack structures and the isolation trenches.

6. The method according to claim 1, wherein forming the support structure in the stack structures and the isolation structures comprises:
   forming a second mask layer having a second preset pattern on the surfaces of the stack structures and the isolation structures, wherein the second preset pattern exposes part of each of the stack structures and part of each of the isolation structures;

removing the exposed isolation structures and the second semiconductor layers of the exposed stack structures by the second mask layer by etching to form etching grooves; and filling a support material in the etching grooves to form the support structure.

7. The method according to claim 1, wherein forming the capacitor structures in the interspace comprises:

forming a first electrode layer, a dielectric layer and a second electrode layer on a surface of each of the zigzag first semiconductor pillars to form the capacitor structures.

8. The method according to claim 7, wherein the method further comprises:

filling a conducting material in an interspace between the second electrode layers to form a conducting layer.

9. The method according to claim 3, wherein after forming the first concave structures and before removing the mask layer, the remaining first semiconductor layers and the remaining isolation structures in sequence, the method further comprises:

rounding the first concave structures to form first cylinders.

10. The method according to claim 9, wherein after removing the mask layer, the remaining first semiconductor layers and the remaining isolation structures in sequence, the method further comprises:

rounding the first convex structure to form second cylinders, wherein the first cylinders and the second cylinders together constitute the zigzag second semiconductor pillars.

11. The method according to claim 10, wherein the method further comprises:

forming the capacitor structures in the interspace between zigzag second semiconductor pillars to form the semiconductor structure.

12. The method according to claim 7, wherein the method further comprises:

performing ion implantation on the zigzag first semiconductor pillars.

13. The method according to claim 11, wherein the method further comprises:

performing ion implantation on the zigzag second semiconductor pillars.

14. The method according to claim 12, wherein the method further comprises:

forming a metal silicide on surfaces of the zigzag first semiconductor pillars.

15. The method according to claim 13, wherein the method further comprises:

forming a metal silicide on surfaces of the zigzag second semiconductor pillars.

* * * * *